US012757417B2

(12) United States Patent
Jo et al.

(10) Patent No.: US 12,757,417 B2
(45) Date of Patent: Oct. 6, 2026

(54) DIELECTRIC MATERIAL AND DEVICE AND MEMORY DEVICE COMPRISING THE SAME

(71) Applicant: Samsung Electronics Co., Ltd., Suwon-si (KR)

(72) Inventors: Giyoung Jo, Suwon-si (KR); Hyeoncheol Park, Hwaseong-si (KR); Daejin Yang, Seoul (KR); Dohwon Jung, Seoul (KR); Taewon Jeong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1081 days.

(21) Appl. No.: 17/344,672

(22) Filed: Jun. 10, 2021

(65) Prior Publication Data

US 2022/0123102 A1 Apr. 21, 2022

(30) Foreign Application Priority Data

Oct. 21, 2020 (KR) ........................ 10-2020-0137083

(51) Int. Cl.

*H10D 1/68* (2025.01)
*C04B 35/468* (2006.01)
(Continued)

(52) U.S. Cl.

CPC ............... *H10D 1/682* (2025.01); *H01B 3/12* (2013.01); *H01G 4/1227* (2013.01);
(Continued)

(58) Field of Classification Search

None
See application file for complete search history.

(56) References Cited

U.S. PATENT DOCUMENTS 6,498,097 B1 * 12/2002 Park ........................ H01L 28/60 438/650
8,273,675 B2 9/2012 Zhang et al.
(Continued)

FOREIGN PATENT DOCUMENTS

CN 101284731 A 10/2008
CN 105130424 A 12/2015
(Continued)

OTHER PUBLICATIONS

Zheng, Z., and Greedan, J.E., "Rare Earth Elements and Materials," in Encyclopedia of Physical Science and Technology (Third Edition), ed. Robert A. Meyers, Academic Press, 2003, pp. 1-22. (Year: 2003).*

(Continued)

*Primary Examiner* — Amber R Orlando
*Assistant Examiner* — Paul Alan Forsyth
(74) *Attorney, Agent, or Firm* — Harness, Dickey & Pierce, P.L.C.

(57) ABSTRACT

The preset invention relates to dielectric material, and device, and memory device comprising the same. According to an aspect, provided is a dielectric material having a composition represented by Formula 1: <Formula 1> (100-x-y)$BaTiO_3$.x$BiREO_3$.y$ABO_3$. wherein, in Formula 1, RE is a rare earth metal, A is an alkali metal, B is a pentavalent transition metal, and 0<x<50, 0<y<50, and 0<x+y<50 are satisfied.

21 Claims, 34 Drawing Sheets

(51) Int. Cl.
*H01B 3/12* (2006.01)
*H01G 4/12* (2006.01)
*H10B 12/00* (2023.01)

(52) U.S. Cl.
CPC .......... *H10B 12/31* (2023.02); *C04B 35/4682* (2013.01); *C04B 2235/3224* (2013.01); *C04B 2235/3255* (2013.01); *C04B 2235/762* (2013.01)

(56) References Cited

U.S. PATENT DOCUMENTS

| | | | |
|---|---|---|---|
| 9,064,635 | B2 | 6/2015 | Wang et al. |
| 2011/0307661 | A1 | 12/2011 | Smith et al. |
| 2015/0009604 | A1 | 1/2015 | Wang et al. |
| 2016/0098193 | A1 | 4/2016 | Shiu |
| 2017/0054627 | A1 | 2/2017 | Rossi et al. |
| 2017/0309810 | A1* | 10/2017 | Sumi ..................... C04B 35/495 |
| 2018/0169649 | A1 | 6/2018 | Yokoyama et al. |
| 2020/0299197 | A1 | 9/2020 | Chung et al. |
| 2022/0005647 | A1 | 1/2022 | Jo et al. |
| 2022/0028613 | A1 | 1/2022 | Jeong et al. |

FOREIGN PATENT DOCUMENTS

| | | | |
|---|---|---|---|
| CN | 107759217 | A | 3/2018 |
| JP | 2012-036032 | A | 2/2012 |

OTHER PUBLICATIONS

Usher, Tedi-Marie, et al., "Local and average structures of BaTiO3—Bi(Zn1/2Ti1/2)O3," J. Appl. Phys., Nov. 14, 2016; 120 (18): 184102. (Year: 2016).*

Ogihara, "Structure—Property—Compositional Relationships in the BaTiO3—BiScO3 Ceramic System" (Master's Thesis, Pennsylvania State Univ., 2008) (Year: 2008).*

Extended Search Report issued on Mar. 1, 2022 in European Patent Application No. 21199248.2.

Extended Search Report issued on Dec. 10, 2021 in European Patent Application No. 21182352.1.

Wei Meng et al., "Effect of BiMO3 (M=A1, In, Y, Sm, Nd, and La) doping on the dielectric properties of BaTiO3 ceramics," Ceramics International, Elsevier, Amsterdam, NL, vol. 43, No. 13, Mar. 23, 2017.

Ogihara H et al., "Structural and Dielectric Properties of BaTiO3—BiScO3 Ceramics," Applications of Ferroelectrics, Feb. 23, 2008.

Zhao Jinyu et al., "Effects of Bi2O3, Sm2O3 content on the structure, dielectric properties and dielectric tunability of BaTiO3 ceramics," Journal of Materials Science: Materials in Electronics, vol. 30, No. 21, Sep. 30, 2019.

Raengthon Natthaphon et al., "Relationship between tolerance factor and temperature coefficient of permittivity of temperature-stable high permittivity BaTiO3—Bi(Me)O3 compounds," Journal of Advanced Dielectrics, vol. 06, No. 01, Mar. 1, 2016.

Syed Mahboob, et al., "Temperature and Stress Induced Electro-mechanical Coupling in Relaxor Ferroelectric Compounds," Ferroelectrics (2015), 481(1), 89-97, Sep. 1, 2015.

Syed Mahboob, et al., "Dielectric Relaxor Ceramics—Solid Solution of Na0.5Bi0.5TiO3 with Ba(Nd0.1Ti0.8Nb0.1)O3," Ferroelectrics (2013), 445(1), 172-181, Aug. 19, 2013.

Syed Mahboob, et al., "Study of dielectric and impedance relaxations in (Na0.125Bi0.125 Ba0.65Ca0.1)(Nd0.065Ti0.87Nb0.065)O3 ceramic," Materials Chemistry and Physics (2006), 99(2-3), 276-283, Oct. 2006.

Vincenzo Buscaglia, et al., "Size and scaling effects in barium titanate. An overview," Journal of the European Ceramic Society 40 (2020) 3744-3758, Jan. 15, 2020.

Zhengbo Shen et al., "BaTiO3.BiYbO3 perovskite materials for energy storage applications," J. Mater. Chem. A, 2015, 3,18146, Jul. 27, 2015.

Kootak Hong et al., "Perspectives and challenges in multilayer ceramic capacitors for next generation electronics," J. Mater. Chem. C, 2019,7, 9782 Jul. 13, 2019.

Hong Tao et al., "Ultrahigh Performance in Lead-Free Piezoceramics Utilizing a Relaxor Slush Polar State with Multiphase Coexistence," J. Am. Chem. Soc. 2019, 141, 13987.13994, Aug. 9, 2019.

First Office Action issued Jul. 3, 2026 in Chinese Application No. 202110709375.5.

* cited by examiner

DIELECTRIC MATERIAL AND DEVICE AND MEMORY DEVICE COMPRISING THE SAME

CROSS-REFERENCE TO RELATED APPLICATION

This application is based on and claims priority under 35 U.S.C. § 119 to Korean Patent Application No. 10-2020-0137083, filed on Oct. 21, 2020, in the Korean Intellectual Property Office, the disclosure of which is incorporated by reference herein in its entirety.

BACKGROUND

1. Field

The present disclosure relates to a dielectric material and a device including the same.

2. Description of Related Art

In accordance with the continuing demand for miniaturization and higher capacity of electronic products, there is a need for capacitors having a smaller size and higher capacity than existing capacitors. In order to implement capacitors having a smaller size and higher capacity, there is a need for dielectric materials that can provide further improved dielectric properties.

To manufacture a multi-layered ceramic capacitor (MLCC), which is a type of small-size, high-capacity capacitor, dielectric material layers need to be made thin. This inevitably induces a rapid increase in electric field, which leads to a reduction in spontaneous polarization of dielectrics, and consequently a remarkable drop in permittivity. Therefore, the need to replace existing dielectrics with a dielectric material that effectively operates in a high-electric field region is gradually increasing.

SUMMARY

Provided is a dielectric material that has improved structural stability and physical properties and effectively operates in a high-electric field region.

Provided is a multi-layer capacitor including the dielectric material.

Additional aspects will be set forth in part in the description which follows and, in part, will be apparent from the description, or may be learned by practice of the presented embodiments of the disclosure.

According to an aspect, provided is a dielectric material having the composition represented by Formula 1.

$$(100\text{-}x\text{-}y)BaTiO_3.xBiREO_3.yABO_3 \quad \text{<Formula 1>}$$

In Formula 1, RE is a rare earth metal, A is an alkali metal, B is a pentavalent transition metal, and $0<x<50$, $0<y<50$, and $0<x+y<50$.

RE may include at least one of scandium (Sc), yttrium (Y), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). In other embodiments, RE may include at least one of Ho, Tm, or Lu.

A may include at least one of sodium (Na), potassium (K), or rubidium (Rb).

B may include at least one of vanadium (V), niobium (Nb), or tantalum (Ta). In other embodiments, B may be Nb.

$0<x\leq 20$, $0<y\leq 10$, and $0<x+y\leq 30$ may be satisfied.

RE may include at least one of Ho, Tm, or Lu; A may include at least one of Na, K, or Rb; and B may include at least one of V, Nb, or Ta.

The dielectric material of Formula 1 may be a dielectric material represented by at least one of: $(100\text{-}x\text{-}y)BaTiO_3.xBiHoO_3.yKNbO_3$, $(100\text{-}x\text{-}y)BaTiO_3.xBiHoO_3.yNaNbO_3$, $(100\text{-}x\text{-}y)BaTiO_3.xBiHoO_3.yRbNbO_3$, $(100\text{-}x\text{-}y)BaTiO_3.xBiTmO_3.yKNbO_3$, $(100\text{-}x\text{-}y)BaTiO_3.xBiTmO_3.yNaNbO_3$, $(100\text{-}x\text{-}y)BaTiO_3.xBiTmO_3.yRbNbO_3$, $(100\text{-}x\text{-}y)BaTiO_3.xBiLuO_3.yKNbO_3$, $(100\text{-}x\text{-}y)BaTiO_3.xBiLuO_3.yNaNbO_3$, or $(100\text{-}x\text{-}y)BaTiO_3.xBiLuO_3.yRbNbO_3$, and wherein, $0<x\leq 20$, $0<y\leq 10$, and $0<x+y\leq 30$.

The dielectric material according to one or more embodiments may be a solid solution.

The solid solution may include a first solid solute and a second solid solute, and the first solid solute may include $BiREO_3$, and the second solid solute may include $ABO_3$.

The dielectric material may comprise a plurality of domains including a ferroelectric material; and a plurality of first polar nanoregions and second nanoregions in each of the plurality of domains, and the dielectric material may be a relaxor-ferroelectric material.

The first polar nanoregions may include a first solid solute, and the second polar nanoregions may include a second solid solute.

The ferroelectric material may include $BaTiO_3$.

At least one of the first or second polar nanoregions may have spontaneous polarization characteristics.

At least one of the first or second polar nanoregions may have a lower energy barrier, in response to an alternating current (AC) sweep, than the ferroelectric material.

The dielectric material may have a pseudo-cubic crystal structure.

The dielectric material may have a permittivity of 900 or more at 0 kV/cm to 87 kV/cm.

The dielectric material may have a temperature efficiency of capacitance (TCC) of −40% to 22% in a temperature range of −55° C. to 125° C.

In other embodiments, the dielectric material may have a TCC of −22% to 22% in a temperature range of −55° C. to 125° C.

The dielectric material may have a resistivity of $1.0\times10^{11}$ Ω·cm or more.

According to another aspect, there is provided a device including a plurality of electrodes; and a dielectric material layer between the plurality of electrodes, wherein the dielectric material layer comprises the dielectric material according to any of the embodiments.

The device may be a multi-layered capacitor.

The plurality of electrodes may include a plurality of first electrodes and a plurality of second electrodes, and the first electrodes and the second electrodes may alternate.

According to another aspect, three is provided a memory device including a transistor and a capacitor, wherein at least one of the transistor or capacitor includes the device according to any of the embodiments.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1A:
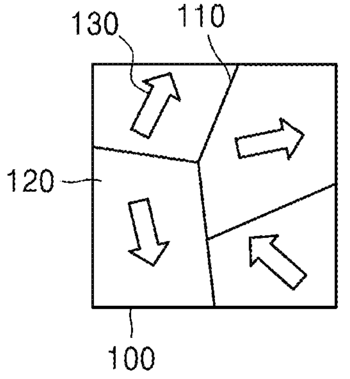
FIGS. 1A to 1C are conceptual diagrams for explaining the polarization behavior of an existing ferroelectric thin film under a high electric field.

Reference will now be made in detail to some example embodiments, examples of which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a dielectric material according to some example embodiments, a multi-layer capacitor including the same, and a method of preparing the dielectric material will be described.

A dielectric material according to an embodiment may include a composition represented by Formula 1.

$$(100\text{-}x\text{-}y)BaTiO_3.xBiREO_3.yABO_3$$ <Formula 1>

In Formula 1, RE represents a rare earth metal; A represents an alkali metal; B represents a pentavalent transition metal; and $0<x<50$, $0<y<50$, and $0<x+y<50$. For example, x and y may respectively represent a molar ratio (and/or molar percentage) of the $BiREO_3$ and $ABO_3$ in the relaxor-ferroelectric material.

The rare earth metal RE may include, for example, at least one of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or a combination thereof.

The alkali metal A may include, for example, at least one of lithium (Li), sodium (Na), potassium (K), rubidium (Rb), and/or a combination thereof.

The pentavalent transition metal B may include, for example, at least one of vanadium (V), niobium (Nb), tantalum (Ta), and/or a combination thereof.

In Formula 1, x, which indicates a composition ratio of $BiREO_3$, may satisfy $0<x<50$, for example, $0<x\leq 20$ or $0<x\leq 15$. Also, for example, x may satisfy $1\leq x<20$, $3\leq x<20$, $5\leq x<20$, $6\leq x<20$, $1\leq x<15$, $3\leq x<15$, $5\leq x<15$ or $6\leq x<15$. The composition ratio x may represent a molar ratio. For example, when x satisfies $0<x\leq 20$, the composition ratio of $BiREO_3$ in the dielectric material of Formula 1 may be greater than 0 mol % and less than or equal to 20 mol %.

In Formula 1, y, which indicates a composition ratio of $ABO_3$, may satisfy $0<y<50$, for example, $0<y\leq 10$ or $0<y\leq 5$. Also, for example, y may satisfy $0.1\leq y<10$, $0.5\leq y<10$, $1\leq y<10$, $0.1\leq y<5$, $0.5\leq y<5$ or $1\leq y<5$. The composition ratio y may represent a molar ratio. For example, when y satisfies $0<y\leq 10$, the composition ratio of $ABO_3$ in the dielectric material of Formula 1 may be greater than 0 mol % and less than or equal to 10 mol %.

In Formula 1, x+y, which is the sum of the composition ratios of $BiREO_3$ and $ABO_3$, may satisfy $0<x+y<50$, for example, $0<x+y\leq 30$, $0<x+y\leq 20$, or $0<x+y\leq 15$. For example, when x+y satisfies $0<x+y\leq 30$, then the sum of the composition ratios of $BiREO_3$ and $ABO_3$ in the dielectric material may be more than 0 mol % and less than or equal to 30 mol %.

The dielectric material of Formula 1 may be in the form of a solid solution. The solid solution may include a base composition, a first solid solute, and a second solid solute. The base composition of the solid solution may include $BaTiO_3$. The first solid solute of the solid solution may include $BiREO_3$, and the second solid solute may include $ABO_3$.

The dielectric material of Formula 1 may be a relaxor-ferroelectric material comprising a plurality of domains. The plurality of domains may include a plurality of first polar nanoregions and a plurality of second polar nanoregions. For example, the dielectric material may be a relaxor-ferroelectric having at least two (e.g., double) polar nanoregions.

The first polar nanoregions may include the first solid solute, and the second polar nanoregions may include the second solid solute.

The dielectric material of Formula 1 may have a perovskite structure and/or may include a pseudo-cubic crystal structure.

Hereinafter, a principle of operation of the dielectric material, according to some example embodiments, will be described in comparison with that of an existing dielectric material.

Figure 1B:
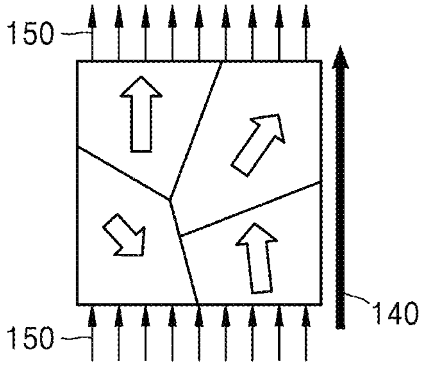
Figure 1C:
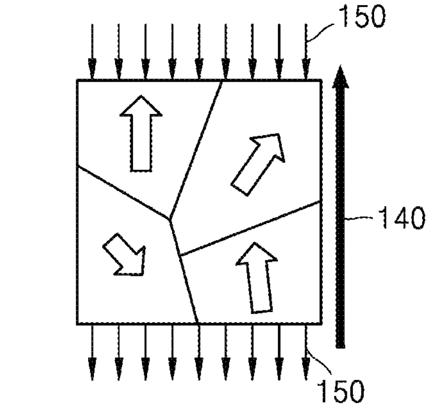

FIGS. 1A to 1C are conceptual diagrams illustrating the polarization behavior of an existing ferroelectric thin film under a high electric field.

In FIG. 1A, a ferroelectric material 100 may be included in a dielectric layer. The thickness of the ferroelectric material 100 may be reduced to several nanometers in accordance with the demand for higher integration and miniaturization. The ferroelectric material 100 may include, for example, $BaTiO_3$ (indicated by BT). The domains 120 of the ferroelectric material may have a polarization 130. The domains 120 may be defined and/or divided by domain walls 110 which border the domain 120. When no electric field is applied to the ferroelectric material 100, the polarization 130 of each of the domains 120 may be in an arbitrary direction as shown in FIG. 1A. When a high direct current (DC) voltage (e.g., a DC bias 140) is applied to the ferroelectric material 100, the ferroelectric material 100 is under a high electric field. Accordingly, the polarization 130 of each domain 120 of the ferroelectric material 100 may mostly align in the same direction as the DC bias 140, such that, as a whole, the ferroelectric material 100 exhibits polarization in the same direction as the DC bias 140, as illustrated in FIG. 1B. Thereafter, as shown in FIG. 1C, even when the direction of an AC bias 150 changes to the opposite direction to the DC bias 140 while the DC bias 140 is present in the ferroelectric material 100, the direction of the polarization 130 of each domain 120 does not change and remains in the same direction as the DC bias 140. As such, after the polarization 130 of the ferroelectric material 100 is fixed in the direction of the DC bias 140, the polarization 130 does not respond to the change of the AC bias 150.

Figure 2A:
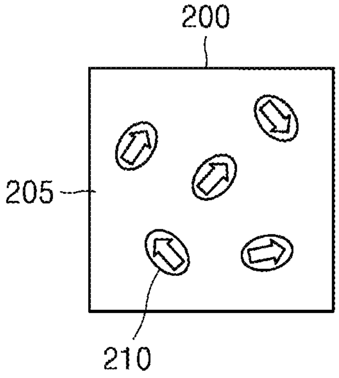
FIGS. 2A to 2C are conceptual diagrams for explaining the polarization behavior of an existing relaxor-ferroelectric thin film under a high electric field.
Figure 2B:
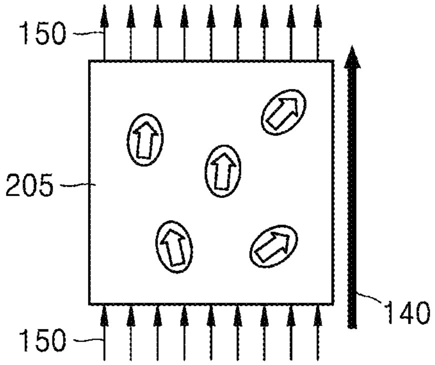
Figure 2C:
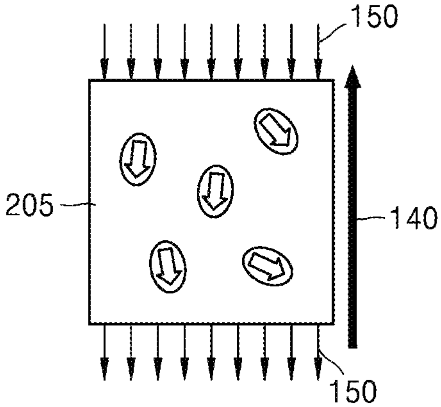

FIG. 2A to 2C are conceptual diagrams for explaining the polarization behavior of an existing relaxor-ferroelectric thin film under a high electric field.

Referring to FIGS. 2A to 2C, an existing relaxor-ferroelectric material 200 includes a ferroelectric material 205, which exhibits a first polarization characteristic, and a polar nanoregion 210, which is included in the ferroelectric material 205 and exhibits a second polarization characteristic. The first polarization characteristic and the second polarization characteristic may be different from each other. The first polarization characteristic and the second polarization characteristic may have spontaneous polarization characteristics. The relaxor-ferroelectric material 200 may be expressed as a relaxor-ferroelectric material layer. The polar nanoregion 210 may be expressed as a polar nanolayer or a polar nanoportion. The ferroelectric material 205 may be expressed as a ferroelectric material layer. When applied in an electronic device (e.g., a capacitor) the ferroelectric material 205 may have a thickness of 1000 nm or less.

The polar nanoregion 210 may include a solid solute. The solid solute may include a different composition from the ferroelectric material 205. For example, the polar nanoregion 210 may be a partial region of the ferroelectric material 205 in which a main element is substituted with a different material. For example, when the ferroelectric material 205 is $BaTiO_3$ (indicated by BT), the polar nanoregion 210 may be a region formed by a defect cluster in which the barium (Ba) in the BT is substituted with a first element different from Ba, and the titanium (Ti) in the BT is substituted with a second element different from Ti. The first element may be an element acting as a donor, and the second element may be an element acting as an acceptor. For example, the first element may be bismuth (Bi), and the second element may be holmium (Ho).

Thus, since the material of the polar nanoregion 210 is different from the ferroelectric material 205, the first polarization characteristic of the ferroelectric material 205 may be different from the second polarization characteristic of the polar nanoregion 210. Accordingly, the energy barrier of the ferroelectric material 205 in response to AC sweeping 150, and the energy barrier of the polar nanoregion 210, may be different from each other. For example, the energy barrier of the polar nanoregion 210, in response to the AC sweeping 150 may be lower than the energy barrier of the ferroelectric material 205. For this reason, as shown in FIGS. 2B and 2C, when the relaxor-ferroelectric material 200 is under a high DC bias 140, the total polarization of the ferroelectric material 205 is fixed in the direction of the DC bias 140, like the ferroelectric material 100 of FIG. 1A, due to the high electric field caused by the DC bias 140, and does not respond to the AC bias 150 applied to the relaxor-ferroelectric material 200, but the polar nanoregion 210 may directly respond to the AC bias 150, and thus the polarization direction of the polar nanoregion 210 may change in response to the AC bias 150.

Figure 3A:
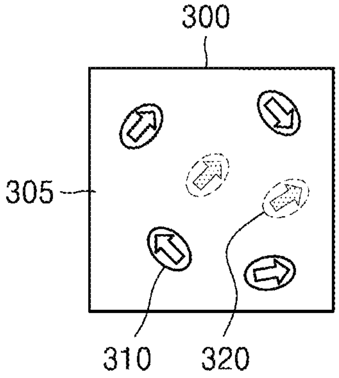
FIGS. 3A to 3C are conceptual views for explaining the polarization behavior of a relaxor-ferroelectric thin film according to some example embodiments under a high electric field.
Figure 3B:
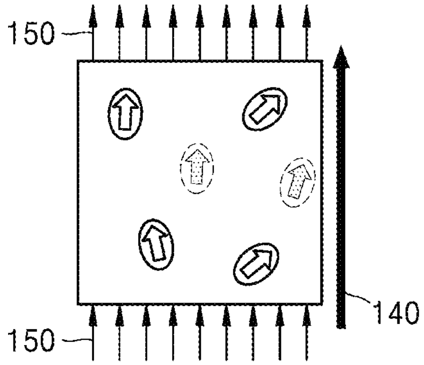
Figure 3C:
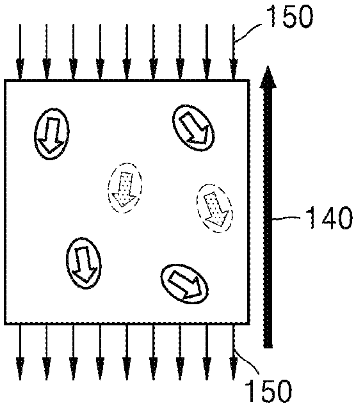

FIG. 3 illustrates conceptual diagrams for explaining the polarization behavior of a relaxor-ferroelectric thin film according to some example embodiments under a high electric field.

Referring to FIG. 3, a relaxor-ferroelectric material 300 according to some example embodiments may include a ferroelectric material 305, which exhibits a first polarization characteristic, and a plurality of polar nanoregions. The plurality of polar nanoregions may include a first polar nanoregion 310 and a second polar nanoregion 320, which are included in the ferroelectric material 305 and which may, respectively, exhibit a second polarization characteristic and a third polarization characteristic. The first polarization characteristic may be different from the second polarization characteristic and the third polarization characteristic. However, the second polarization characteristic and the third polarization characteristic may be similar. The first polarization characteristic, the second polarization characteristic, and the third polarization characteristic may have spontaneous polarization characteristics. The relaxor-ferroelectric material 300 may be expressed as a relaxor-ferroelectric layer. The polar nanoregions 310 and 320 may be expressed as polar nanolayers or polar nanoportions. The ferroelectric material 305 may be expressed as a ferroelectric material layer.

The first polar nanoregion 310 and the second polar nanoregion 320 may include solid solutes different from the ferroelectric material 305. The first polar nanoregion 310 may include a first solid solute, and the second polar nanoregion 320 may include a second solid solute. The first solid solute and the second solid solute may be the same as described above.

The first polar nanoregion 310 may be a region formed by a defect cluster in which Ba in the $BaTiO_3$ is substituted with a first element different from Ba, and Ti in the $BaTiO_3$ is substituted with a second element different from Ti. The first element may be an element acting as a donor, and the second element may be an element acting as an acceptor. For example, the first element may be bismuth (Bi), and the second element may be a rare earth element.

The second polar nanoregion 320 may be a region formed by a defect cluster in which Ba in the $BaTiO_3$ is substituted with a third element different from Ba, and Ti in the $BaTiO_3$ is substituted with a fourth element different from Ti. The third element may be an element acting as an acceptor, and the fourth element may be an element acting as a donor. For example, the third element may be a monovalent element, and the fourth element may be a pentavalent element.

As described above with reference to FIGS. 2A to 2C, the dielectric material according to some example embodiments can achieve, through a primary solid solution using a first solid solute, reduced fixation and increased permittivity of the $BaTiO_3$ dielectric material under a high electric field. According to some example embodiments, further to the primary solid solution using a first solid solute, through a secondary solid solution using a second solid solute, further reduced fixation and accordingly further increased permittivity of the $BaTiO_3$ dielectric material under a high-electric field can be achieved. For example, the degree of shift of the lattices may be increased by the secondary solid solution using $ABO_3$ (wherein A is a Group 1 element and B is a Group 5 element), and accordingly, the energy barrier of the polar nanoregion (PNR) that responds to an AC bias under a high electric field may be lowered. In addition, the dielectric constant (effective dielectric constant) under a high electric field may increase due to different types of double-polar nanoregions (PNRs). In addition, since the second solid solute, according to some example embodiments, includes elements having a relatively high diffusion rate, a sintering temperature can be reduced to be lower than that of the solid solution of BT-$BiREO_3$, the second solid solute may be advantageous in application to a current process of manufacturing multi-layered ceramic capacitors (MLCC) with simultaneous sintering with an Ni electrode.

The relaxor-ferroelectric materials 200 and 300 of FIGS. 2A to 2C and 3A to 3C may include a plurality of domains, like the ferroelectric material 100 of FIGS. 1A to 1C, but these are not illustrated in FIGS. 2A to 2C and 3A to 3C for convenience. Each domain may include a plurality of polar nanoregions 210 (310, and/or 320). As discussed above, the polarization characteristics of the other regions (e.g., regions not including the polar nanoregions 210 (310, and/or 320)) in each domain may be different from that of the polar nanoregions 210 (310, and/or 320).

The dielectric material according to some example embodiments may be, for example, a solid solution represented by Formula 2, Formula 3, or Formula 4.

$$(100\text{-}x\text{-}y)BaTiO_3.xBiHoO_3.yABO_3 \qquad \text{<Formula 2>}$$

$$(100\text{-}x\text{-}y)BaTiO_3.xBiTmO_3.yABO_3\text{<} \qquad \text{Formula 3>}$$

$$(100\text{-}x\text{-}y)BaTiO_3.xBiLuO_3.yABO_3 \qquad \text{<Formula 4>}$$

In Formula 2 to Formula 4, A is an alkali metal (e.g. Na, K or Rb), B is a pentavalent transition metal (e.g., Nb), and $0<x<50$, $0<y<50$, and $0<x+y<50$.

The dielectric material according to some example embodiments may include a dielectric material having the following composition:

$(100\text{-x-y})BaTiO_3.xBiHoO_3.yKNbO_3$, $(100\text{-x-y})BaTiO_3.xBiHoO_3.yNaNbO_3$, $(100\text{-x-y})BaTiO_3.xBiHoO_3.yRbNbO_3$, $(100\text{-x-y})BaTiO_3.xBiTmO_3.yKNbO_3$, $(100\text{-x-y})BaTiO_3.xBiTmO_3.yNaNbO_3$, $(100\text{-x-y})BaTiO_3.xBiTmO_3.yRbNbO_3$, $(100\text{-x-y})BaTiO_3.xBiLuO_3.yKNbO_3$, $(100\text{-x-y})BaTiO_3.xBiLuO_3.yNaNbO_3$, or $(100\text{-x-y})BaTiO_3.xBiLuO_3.yRbNbO_3$.

In the formulae above, x and y may satisfy that $0<x<50$, $0<y<50$, and $0<x+y<50$; for example, $0<x\leq 20$, $0<y\leq 10$, and $0<x+y\leq 30$; and for example, $0<x\leq 15$, $0<y\leq 5$, and $5<x+y\leq 20$.

Optionally, a dielectric material according to some example embodiments may include, a dielectric material having one of the following compositions:

$(100\text{-x-y})BaTiO_3.xBiCeO_3.yKNbO_3$, $(100\text{-x-y})BaTiO_3.xBiCeO_3.yNaNbO_3$, $(100\text{-x-y})BaTiO_3.xBiCeO_3.yRbNbO_3$, $(100\text{-x-y})BaTiO_3.xBiPrO_3.yKNbO_3$, $(100\text{-x-y})BaTiO_3.xBiPrO_3.yNaNbO_3$, $(100\text{-x-y})BaTiO_3.xBiPrO_3.yRbNbO_3$, $(100\text{-x-y})BaTiO_3.xBiNdO_3.yKNbO_3$, $(100\text{-x-y})BaTiO_3.xBiNdO_3.yNaNbO_3$, $(100\text{-x-y})BaTiO_3.xBiNdO_3.yRbNbO_3$, $(100\text{-x-y})BaTiO_3.xBiPmO_3.yKNbO_3$, $(100\text{-x-y})BaTiO_3.xBiPmO_3.yNaNbO_3$, $(100\text{-x-y})BaTiO_3.xBiPmO_3.yRbNbO_3$, $(100\text{-x-y})BaTiO_3.xBiSmO_3.yKNbO_3$, $(100\text{-x-y})BaTiO_3.xBiSmO_3.yNaNbO_3$, $(100\text{-x-y})BaTiO_3.xBiSmO_3.yRbNbO_3$, $(100\text{-x-y})BaTiO_3.xBiEuO_3.yKNbO_3$, $(100\text{-x-y})BaTiO_3.xBiEuO_3.yNaNbO_3$, $(100\text{-x-y})BaTiO_3.xBiEuO_3.yRbNbO_3$, $(100\text{-x-y})BaTiO_3.xBiGdO_3.yKNbO_3$, $(100\text{-x-y})BaTiO_3.xBiGdO_3.yNaNbO_3$, $(100\text{-x-y})BaTiO_3.xBiGdO_3.yRbNbO_3$, $(100\text{-x-y})BaTiO_3.xBiTbO_3.yKNbO_3$, $(100\text{-x-y})BaTiO_3.xBiTbO_3.yNaNbO_3$, $(100\text{-x-y})BaTiO_3.xBiTbO_3.yRbNbO_3$, $(100\text{-x-y})BaTiO_3.xBiDyO_3.yKNbO_3$, (100-x-y)

$BaTiO_3.xBiDyO_3.yNaNbO_3$, $(100\text{-}x\text{-}y)BaTiO_3.xBiDyO_3.yRbNbO_3$, $(100\text{-}x\text{-}y)BaTiO_3.xBiErO_3.yKNbO_3$, $(100\text{-}x\text{-}y)BaTiO_3.xBiErO_3.yNaNbO_3$, $(100\text{-}x\text{-}y)BaTiO_3.xBiErO_3.yRbNbO_3$, $(100\text{-}x\text{-}y)BaTiO_3.xBiYbO_3.yKNbO_3$, $(100\text{-}x\text{-}y)BaTiO_3.xBiYbO_3.yNaNbO_3$, and/or $(100\text{-}x\text{-}y)BaTiO_3.xBiYbO_3.yRbNbO_3$.

In the formulae above, x and y may satisfy that $0<x<50$, $0<y<50$, and $0<x+y<50$; for example, $0<x\leq 20$, $0<y\leq 10$, and $0<x+y\leq 30$; and for example, $0<x\leq 15$, $0<y\leq 5$, and $0<x+y\leq 20$.

The dielectric material having the composition represented by Formula 1 may have a pseudo-cubic crystal structure. Herein the pseudo-cubic crystal structure, which includes a crystal structure similar to a crystal structure in the process of transitioning from a tetragonal structure to a cubic structure, refers to a crystal structure similar to the cubic structure in which a ratio of the c-axis to the a-axis is close to 1.

The dielectric material according to some example embodiments may have a permittivity of 900 or more at room temperature (e.g., 25° C.) at 0 kV/cm to 87 kV/cm, whereby a capacitor including the dielectric material may have improved dielectric properties, and it may become easier to manufacture a smaller, thinner, higher-capacity capacitor. The dielectric material according to one or more embodiments may have a permittivity of 900 or more, for example, 950 to 4000, or 1000 to 3500 at room temperature (e.g., 25° C.) at 0 kV/cm to 87 kV/cm.

(Device)

According to another aspect, a device includes: a plurality of electrodes; and a dielectric material layer disposed between the plurality of electrodes, wherein the dielectric material layer includes the dielectric material according to one or more example embodiments as described above.

The device may be, for example, a capacitor. The capacitor may include a plurality of internal electrode, and a dielectric material layer alternately disposed between the plurality of internal electrodes.

The dielectric material layer may have a resistivity of 1.0E+9 Ω·cm or greater; for example, 1.0E+11 Ω·cm or greater; and, for example, 1.2 to 4 E+11 Ω·cm. As discussed above, the dielectric material layer may have good insulating characteristics.

By including the dielectric material according to the above-described embodiments, the device according to one or more embodiments may have improved dielectric characteristics, and consequently have improved electric characteristics.

The device may be included in an electric circuit, an electronic circuit, an electromagnetic circuit, or the like, and is not particularly limited as long as, for example, the device provides an electrical output for an electrical input. The electrical input may be current and/or voltage, and the current may be direct current or alternating current. The electrical input may be continuous input and/or intermittent input with a constant cycle. The device may store electrical energy, electrical signals, magnetic energy, and/or magnetic signals. The device may include a semiconductor, and/or may be a memory, a processor, or the like. The device may include, for example, a resistor, an inductor, a capacitor, or the like.

For example, when the device is a capacitor, the capacitor may be, a multi-layered capacitor including a plurality of internal electrodes; and the above-described dielectric material layer may be alternately disposed between the plurality of internal electrodes. The capacitor may have an independent device form, such as a multi-layered capacitor, but is not necessarily limited to such a form, and may be included as part of a memory. The capacitor may be, for example, a metal insulator metal (MIM) capacitor mounted in a memory device.

Figure 4:
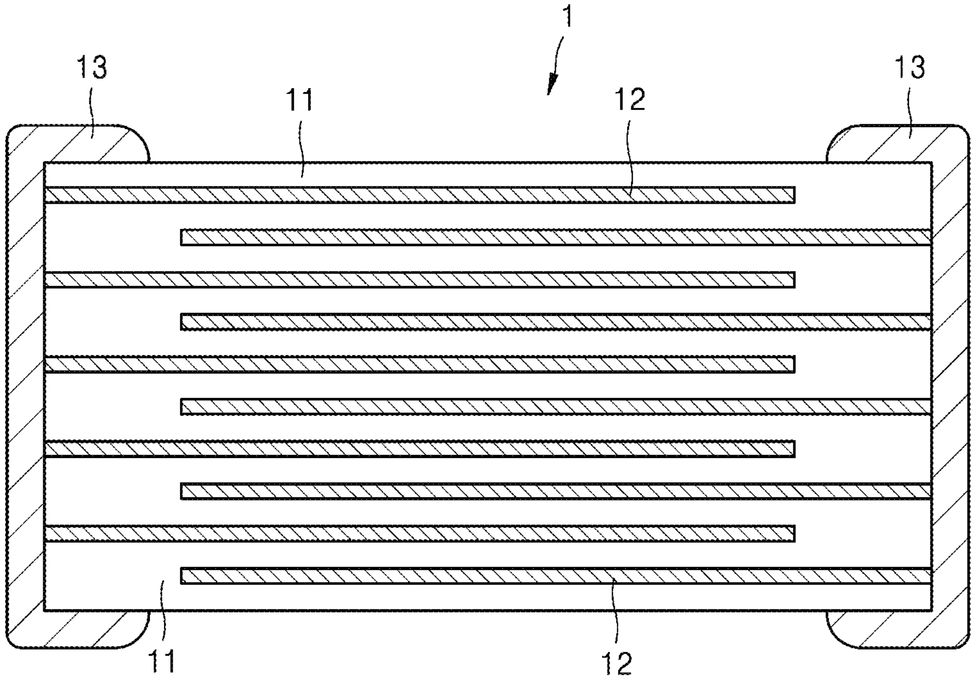
FIG. 4 is a schematic view of a multi-layered ceramic capacitor (MLCC) according to some example embodiments.

FIG. 4 is a schematic view of a multi-layered ceramic capacitor (MLCC) according to an embodiment.

Referring to FIG. 4, a multi-layered capacitor 1 according to an example embodiment may include: a plurality of internal electrodes 12; and a dielectric material layer 11 alternately disposed between the plurality of internal electrodes 12. The multi-layered capacitor 1 may have a structure in which the plurality of internal electrodes 12 and the dielectric material layer 11 are alternately stacked, and the dielectric material layer 11 may include the dielectric material according to one or more embodiments. The adjacent internal electrodes 12 may be electrically separated from one another by the dielectric material layer 11 therebetween. In the multi-layered capacitor 1, as the internal electrodes 12 and the dielectric material layer 11 are alternately stacked, the adjacent internal electrodes 12 and the dielectric material layer 11 disposed between the adjacent internal electrodes 12 may act as a single unit capacitor. In the multi-layered capacitor 1, the number of the internal electrodes 12 and the number of the dielectric material layers 11, which are alternately stacked, may each independently be, for example, 2 or greater, 5 or greater, 10 or greater, 20 or greater, 50 or greater, 100 or greater, 200 or greater, 500 or greater, 1,000 or greater, 2,000 or greater, 5,000 or greater, or 10,000 or greater. The multi-layered capacitor 1 may provide capacitance through a stacked structure in which a plurality of unit capacitors are stacked. As the number of the stacked internal electrodes 12 and the dielectric material layer 11 increases, a contact area thereof may increase, thus improving the capacitance. For example, the internal electrodes 12 may be disposed to have an area smaller than the area of the dielectric material layer 11. For example, the plurality of the internal electrodes 12 may each have an identical area; however, the adjacent internal electrodes 12 may be disposed not to be in the same position along the thickness direction of the multi-layered capacitor 1, and to partially and alternately protrude in the directions of the opposing side surfaces of the multi-layered capacitor 1. The internal electrodes 12 may include a conductive material, such as a metal and/or a metal alloy like nickel (Ni), copper (Cu), palladium (Pd), and/or a palladium-silver (Pd—Ag) alloy. The internal electrodes 12 may be formed, for example, using a conductive paste including the conductive material. A printing method of the conductive paste may be a screen printing method and/or a gravure printing method, but is not necessarily limited thereto, and any method of forming internal electrodes, the method being used in the art, may be used. The internal electrodes 12 may have a thickness of, for example, 100 nm to 5 μm, 100 nm to 2.5 μm, 100 nm to 1 μm, 100 nm to 800 nm, 100 nm to 400 nm, or 100 nm to 200 nm.

Referring to FIG. 4, the plurality of internal electrodes 12, which are alternately stacked to partially protrude in the directions of opposing side surfaces of the multi-layered capacitor 1, may be electrically connected to external electrodes 13. The external electrodes 13 may be disposed, for example, on a multi-layered structure including the plurality of internal electrodes 12 and the dielectric material layer 11 alternately disposed between the plurality of the internal electrodes 12, and connected to the internal electrodes 12. The multi-layered capacitor 1 may include the internal electrodes 12, and external electrodes 13 respectively connected to the internal electrodes 12. The multi-layered capacitor 1 may include, for example, a pair of external electrodes 13 surrounding the opposing sides of a multi-layered structure including the internal electrodes 12 and the dielectric material layer 11. The external electrodes 13 include an electrically conductive material, such as metal, and/or may be a specific material, which may have specifics electrical characteristics, structural stability, and/or the like. The external electrodes 13 may have, for example, a multi-layer structure. The external electrodes 13 may include, for example, an electrode layer contacting the internal electrodes 12 and consisting of Ni, and a plating layer on the electrode layer.

Referring to FIG. 4, for example, the dielectric material layers 11 in the multi-layered capacitor 1 may be disposed to have a larger area than the area of the adjacent internal electrodes 12. The dielectric material layers 11 disposed between the adjacent internal electrodes 12 in the multi-layered capacitor 1 may be connected to each other. The dielectric material layers 11 disposed between the adjacent internal electrodes 12 may be connected to one another on the sides in contact with the external electrodes 13 in the multi-layered capacitor 1. The external electrodes 13 may be, for example, omitted. When the external electrodes 13 are omitted, the internal electrodes 12 may protrude to the opposing sides of the multi-layered capacitor 1 and connected to a power source.

In a unit capacitor including the adjacent internal electrodes 12 and the dielectric material layers 11 disposed therebetween, a thickness of the dielectric material layer 11 and/or a gap between the adjacent internal electrodes 12, may be, for example, 10 nm to 1 μm, 100 nm to 800 nm, 100 nm to 600 nm, or 100 nm to 300 nm. In a unit capacitor including the adjacent internal electrodes 12 and the dielectric material layers 11 disposed therebetween, a permittivity of the dielectric material layer 11 may be, for example, 1,000 or greater at room temperature (25° C.) in a range of 0 kV/cm to 90 kV/cm.

By the inclusion of the dielectric material layer 11 having such a small thickness and high permittivity, the multi-layered capacitor 1 may have improved capacitance and have reduced thickness and volume. Accordingly, a small and/or thin capacitor with higher capacity may be provided.

(Dielectric Material Preparation Method)

Figure 5:
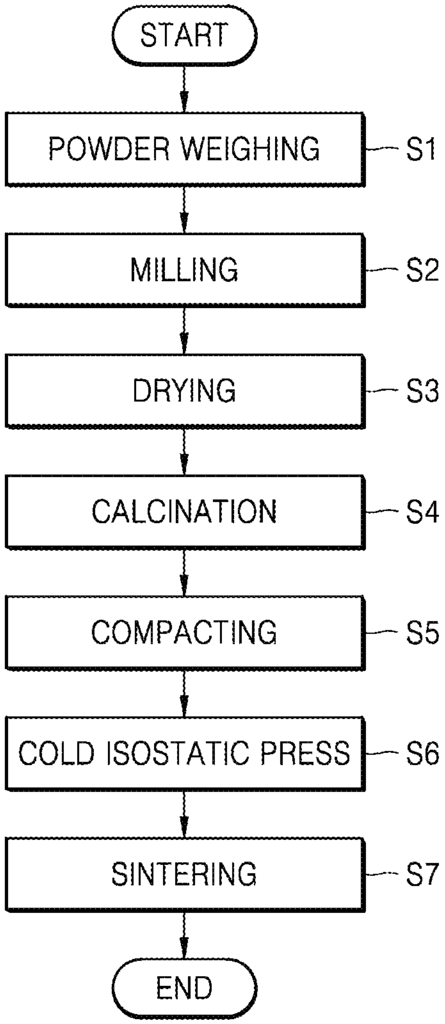
FIG. 5 is a flowchart illustrating each step in a method of synthesizing a relaxor-ferroelectric material according to some example embodiments.

FIG. 5 is a flowchart illustrating each step in a method of preparing a dielectric material according to an embodiment. FIG. 5 illustrates the sequence of preparation using a solid phase method.

Referring to FIG. 5, a method of preparing a dielectric material having the composition of Formula 1 may include a powder weighing step S1, a milling step S2, a drying step S3, a calcination step S4, a compacting step S5, a cold isostatic press (CIP) step S6, and a sintering step S7.

In the powder weighing step S1, raw materials or precursors according to the composition of the dielectric material are quantified and mixed according to a molar ratio. The weighing ratio may be determined considering the composition of the dielectric material to be finally obtained. In the powder weighing step S1, for the composition of Formula 1, $(100\text{-x-y})BaTiO_3\text{-x}BiREO_3\text{-y}ABO_3$, powders containing oxidized Ba, Ti, Bi, RE, A, and/or B may be used as raw material. For example, $BaCO_3$ may be used as a raw material for Ba, $TiO_2$ may be used as a raw material for Ti, $Bi_2O_3$ may be used as a raw material for Bi, $RE_2O_3$ may be used as a raw material for RE, $A_2CO_3$ may be used as a raw material for A, which is a Group 1 element, and $B_2O_5$ may be used as a raw material for B, which is a Group 5 element. However, embodiments are not limited thereto.

The raw material for RE may be, for example, $Sc_2O_3$, $Y_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, or $Lu_2O_3$. The raw material for A may be, for example, $K_2CO_3$, $Na_2CO_3$, or $Rb_2CO_3$. The raw material for B may be, for example, $Nb_2O_5$, $V_2O_5$, or $Ta_2O_5$. The amounts of the above-described raw materials are stoichiometrically controlled to obtain the compound of Formula 1.

In the milling step (S2), the weighed raw materials are mixed and ground. The milling step (S2) may include mechanically milling the raw materials and may include, for example, a ball mill, an airjet mill, a bead mill, a roll mill, a planetary mill, a hand mill, a high-energy ball mill, a stirred ball mill, a vibrating mill, or a combination thereof. The milling step (S2) may be performed using, for example, planetary milling. The milling step (S2) may include, for example, wet milling some and/or all of the raw materials using a solvent. The solvent may include, for example, an alcohol like methanol and/or ethanol. The milling step (S2) may include, for example, dry milling some and/or all of the raw materials. In an example, the milling step (S2) may be performed by wet milling the raw materials for about 12 hours.

When the milling is wet milling, a resulting product from the milling step (S2) may be dried in the drying step (S3). The solvent used in the milling step (S2) may be removed through the drying step (S3).

In the calcination step (S4), a volatile component and/or compounds may be removed from the resulting product from the drying step (S3), and thus, the purity of the material may increase. The calcination step (S4) may be a first heat-treatment step. Because reaction gases are generated near the calcination temperature, the dielectric material may be maintained at and/or near the calcination temperature for a certain period of time to prevent stress and crack of the material due to the reaction gas. The calcination step (S4) may be performed at a temperature that is equal to or lower than the melting point of a target material. Through the calcination step (S4), the purity of a ceramic material of the relaxor-ferroelectric material may increase and the solid-state reaction may be promoted. In some example embodiments, the calcination step (S4) may be performed in an air atmosphere at 800° C. to 900° C. for about 10 hours.

The compacting step (S5) includes molding the resulting product from the calcination step (S4) into a desired shape. In the compacting step (S5), the outer shape of the dielectric material may be formed. For example, the resulting product from the calcination step (S4) may be compacted into a mold.

The CIP step (S6) includes press-molding the resulting product from the compacting step (S5) by applying a high pressure evenly to the surface of the resulting product molded through the compacting step (S5). In some example embodiments, in the CIP step (S6), a pressure of about 200 MPa may be applied to the resulting product molded through the compacting step (S5).

The sintering step (S7) includes baking the resulting product from the CIP step (S6) at a high temperature. The sintering step (S7) may be a second heat-treatment step. In an example, the sintering step (S7) may be performed in an air atmosphere at 1250° C. to 1500° C. for about 5 hours.

The dielectric material according to one or more embodiments prepared through the above-described processes may be a high-dielectric material for an MLCC with miniaturization and high-performance, the dielectric material being pseudo-cubic and having multiple polar nanoregions. In addition, the dielectric material may be in a dense state with a relative density of 99% or more.

The dielectric material according to one or more embodiments may be included in a piezoelectric actuator, a multi-layered dielectric material for an antenna, a nonvolatile memory device, and/or the like. In addition, the dielectric material according to one or more embodiments may be implemented as an MLCC, and be applicable to component devices of mobile phones/televisions and vehicles.

Figure 17A:
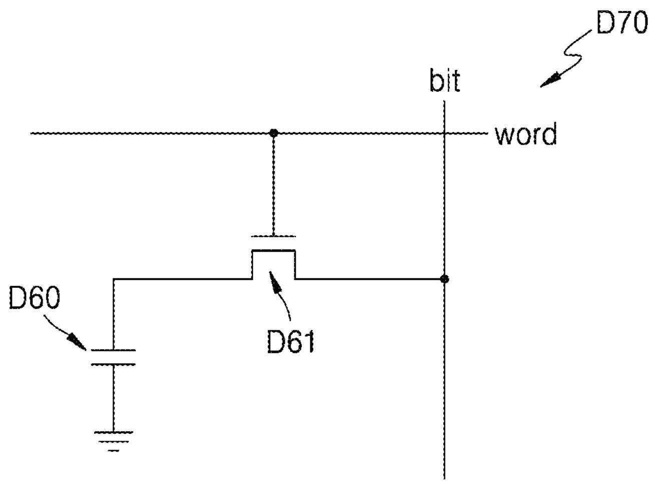
FIG. 17A illustrates a circuit configuration of a memory cell of a memory device including a semiconductor device and a capacitor.
Figure 17B:
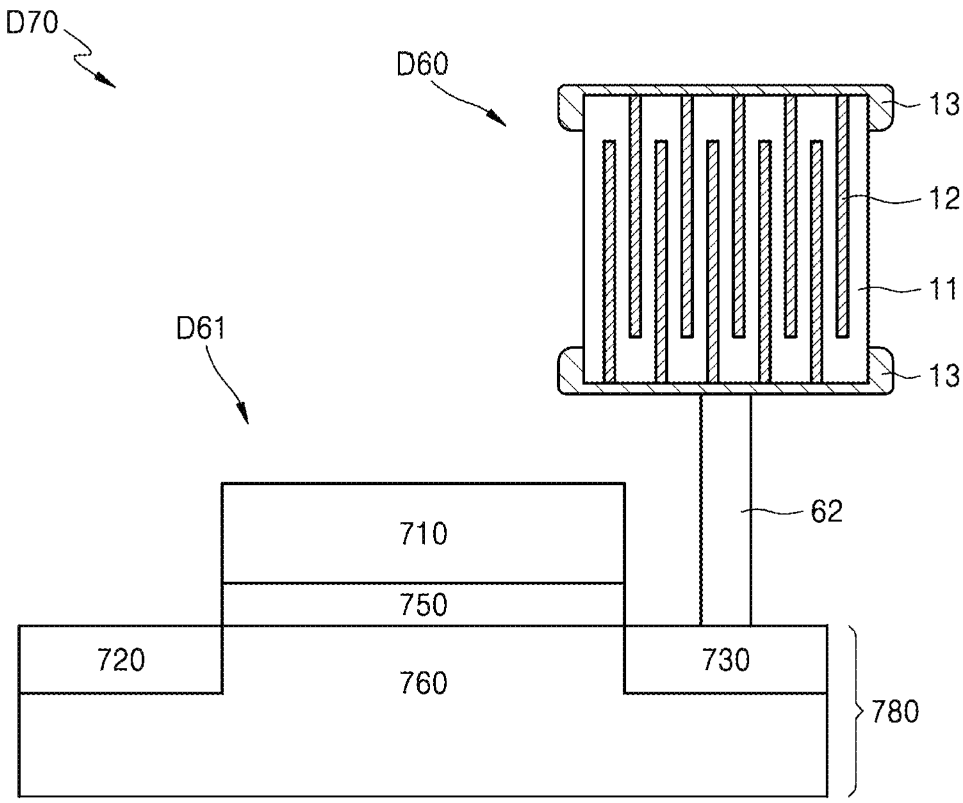
FIG. 17B is a schematic diagram showing a semiconductor device according to an example embodiment.

FIG. 17A illustrates a circuit configuration of a memory cell of a memory device including a semiconductor device and a capacitor. FIG. 17B is a schematic diagram showing a semiconductor device according to an example embodiment.

Referring to FIG. 17A, the semiconductor device D70 may be included in a memory device as a memory cell and may include a transistor D61 and a capacitor D60 electrically connected to, for example, a source region 730 of the transistor D61. The memory device may include a plurality of bit lines and a plurality of word lines, and may further include a plurality of the memory cells. Each word line may be electrically connected to a gate electrode 710 of the transistor D61, and each bit line may be electrically connected to a drain region 720 of the transistor D61. An electrode of the capacitor D60 may be connected to, for example, a voltage controller (not shown). For example, referring to FIG. 17B, a semiconductor device D70 may include a capacitor D60 including a relaxor-ferroelectric material 300, and a field effect transistor D61 electrically connected to the capacitor D60 by a contact 62. The capacitor D60 may be, for example the multi-layer capacitor 1 of FIG. 4. One of the outer electrodes 13 of the capacitor D60 and one of the source region 730 and the drain region 720 of the transistor D61 may be electrically connected by a contact 62. The contact 62 may include a conductive material, such as tungsten, copper, aluminum, polysilicon, and the like.

The field effect transistor D61 may include a substrate 780 including a source region 730, a drain region 720, and a channel 760, and a gate electrode 710 facing the channel 760. A dielectric layer 750 may be between the substrate 780 and the gate electrode 710. The field effect transistor D61 of FIG. 17B shows an example that does not include the ferroelectric material 300, but the field effect transistor may also include the ferroelectric material 300.

One or more embodiments of the present disclosure will now be described in detail with reference to the following examples and comparative examples.

Example 1: Preparation of $91BaTiO_3.8BiHoO_3.1KNbO_3$ Dielectric Material

Raw material powders ($BaCO_3$, $TiO_2$, $Bi_2O_3$, $Ho_2O_3$, $K_2CO_3$, and $Nb_2O_5$) were weighed in ratios to obtain the stoichiometry of $91BaTiO_3.8BiHoO_3KNbO_3$, put into a planetary milling apparatus to which ethanol and zirconia balls had been added, and then subjected to ball milling in an air atmosphere at room temperature for 12 hours. The ball-milled mixture was dried at 200° C. for 2 hours to obtain dried mixed powder. The dried mixed powder was put into an alumina crucible and then subjected to a first heat treatment in an air atmosphere at 800° C. for 10 hours. The first heat-treated product was pressed with uniaxial pressure to prepare pellets. The prepared pellets were cold isostatic pressed at 250 Mpa pressure and then subjected to second heat treatment in an air atmosphere at 1400° C. for 5 hours to prepare a dielectric material with a solid solution including the composition of $91BaTiO_3.8BiHoO_3.1KNbO_3$.

Example 2: Preparation of $90BaTiO_3.8BiHoO_3.2KNbO_3$ Dielectric Material

A dielectric material was prepared in the same manner as in Example 1, except that the amounts of the raw material powders were controlled such that the dielectric material prepared had a solid solution with the composition ratio of $90BaTiO_3.8BiHoO_3.2KNbO_3$.

Example 3: Preparation of $89BaTiO_3.8BiHoO_3.3KNbO_3$ Dielectric Material

A dielectric material was prepared in the same manner as in Example 1, except that the amounts of the raw material powders were controlled such that the dielectric material prepared had a solid solution with the composition ratio of $89BaTiO_3.8BiHoO_3.3KNbO_3$.

Example 4: Preparation of $91BaTiO_3.8BiTmO_3.1KNbO_3$ Dielectric Material

A dielectric material was prepared in the same manner as in Example 1, except that $Tm_2O_3$ was used instead of $Ho_2O_3$, to obtain $BiTmO_3$ instead of $BiHoO_3$.

Example 5: Preparation of $90BaTiO_3.8BiTmO_3.2KNbO_3$ Dielectric Material

A dielectric material was prepared in the same manner as in Example 4, except that the amounts of the raw material powders were controlled such that the dielectric material prepared had a solid solution with the composition ratio of $90BaTiO_3.8BiTmO_3.2KNbO_3$.

Example 6: Preparation of $89BaTiO_3.8BiTmO_3.3KNbO_3$ Dielectric Material

A dielectric material was prepared in the same manner as in Example 4, except that the amounts of the raw material powders were controlled such that the dielectric material prepared had a solid solution with the composition ratio of $89BaTiO_3.8BiTmO_3.3KNbO_3$.

Example 7: Preparation of $91BaTiO_3.8BiLuO_3.1KNbO_3$ Dielectric Material

A dielectric material was prepared in the same manner as in Example 1, except that $Lu_2O_3$ was used instead of $Ho_2O_3$, to obtain $BiLuO_3$ instead of $BiHoO_3$.

Example 8: Preparation of $90BaTiO_3.8BiLuO_3.2KNbO_3$ Dielectric Material

A dielectric material was prepared in the same manner as in Example 7, except that the amounts of the raw material powders were controlled such that the dielectric material prepared had a solid solution with the composition ratio of $90BaTiO_3.8BiLuO_3.2KNbO_3$.

Example 9: Preparation of $89BaTiO_3.8BiLuO_3.3KNbO_3$ Dielectric Material

A dielectric material was prepared in the same manner as in Example 7, except that the amounts of the raw material powders were controlled such that the dielectric material prepared had a solid solution with the composition ratio of $89BaTiO_3.8BiLuO_3.3KNbO_3$.

Example 10: Preparation of $91BaTiO_3.8BiTmO_3.1NaNbO_3$ Dielectric Material

A dielectric material was prepared in the same manner as in Example 4, except that $Na_2CO_3$ was used instead of $K_2CO_3$ to obtain $NaNbO_3$ instead of $KNbO_3$.

Example 11: Preparation of $90BaTiO_3.8BiTmO_3.2NaNbO_3$ Dielectric Material

A dielectric material was prepared in the same manner as in Example 10, except that the amounts of the raw material powders were controlled such that the dielectric material prepared had a solid solution with the composition ratio of $90BaTiO_3$. $8BiTmO_3$. $2NaNbO_3$.

Example 12: Preparation of $89BaTiO_3.8BiTmO_3.3NaNbO_3$ Dielectric Material

A dielectric material was prepared in the same manner as in Example 10, except that the amounts of the raw material powders were controlled such that the dielectric material prepared had a solid solution with the composition ratio of $89BaTiO_3$. $8BiTmO_3$. $3NaNbO_3$.

Example 13: Preparation of $91BaTiO_3.8BiTmO_3.1RbNbO_3$ Dielectric Material

A dielectric material was prepared in the same manner as in Example 4, except that $Rb_2CO_3$ was used instead of $K_2CO_3$, to obtain $RbNbO_3$ instead of $KNbO_3$.

Example 14: Preparation of $90BaTiO_3$ $8BiTmO_3$ $2RbNbO_3$ Dielectric Material A dielectric material was prepared in the same manner as in Example 13, except that the amounts of the raw material powders were controlled such that the dielectric material prepared had a solid solution with the composition ratio of $90BaTiO_3$. $8BiTmO_3.2RbNbO_3$.

Example 15: Preparation of $89BaTiO_3.8BiTmO_3.3RbNbO_3$ Dielectric Material

A dielectric material was prepared in the same manner as in Example 13, except that the amounts of the raw material powders were controlled such that the dielectric material prepared had a solid solution with the composition ratio of $89BaTiO_3$. $8BiTmO_3.3RbNbO_3$.

Example 16: Preparation of $91BaTiO_3.6BiHoO_3.3KNbO_3$ Dielectric Material

A dielectric material was prepared in the same manner as in Example 1, except that the amounts of the raw material powders were controlled such that the dielectric material prepared had a solid solution with the composition ratio of $91BaTiO_3.6BiHoO_3.3KNbO_3$.

Example 17: Preparation of $91BaTiO_3.6BiHoO_3.3NaNbO_3$ Dielectric Material

A dielectric material was prepared in the same manner as in Example 16, except that $Na_2CO_3$ was used instead of $K_2CO_3$, to obtain $NaNbO_3$ instead of $KNbO_3$.

Example 18: Preparation of $91BaTiO_3.6BiHoO_3.3RbNbO_3$ Dielectric Material

A dielectric material was prepared in the same manner as in Example 16, except that $Rb_2CO_3$ was used instead of $K_2CO_3$, to obtain $RbNbO_3$ instead of $KNbO_3$.

Example 19: Preparation of $91BaTiO_3.6BiTmO_3.3KNbO_3$ Dielectric Material

A dielectric material was prepared in the same manner as in Example 4, except that the amounts of raw material powder were controlled such that the dielectric material prepared had a solid solution with the composition ratio of $91BaTiO_3.6BiTmO_3.3KNbO_3$.

Example 20: Preparation of $91BaTiO_3.6BiTmO_3.3NaNbO_3$ Dielectric Material

A dielectric material was prepared in the same manner as in Example 10, except that the amounts of raw material powder were controlled such that the dielectric material prepared had a solid solution with the composition ratio of $91BaTiO_3.6BiTmO_3.3NaNbO_3$.

Example 21: Preparation of $91BaTiO_3.6BiTmO_3.3RbNbO_3$ Dielectric Material

A dielectric material was prepared in the same manner as in Example 13, except that the amounts of the raw material powders were controlled such that the dielectric material prepared had a solid solution with the composition ratio of $91BaTiO_3.6BiTmO_3.3RbNbO_3$.

Example 22: Preparation of $91BaTiO_3.6BiLuO_3.3KNbO_3$ Dielectric Material

A dielectric material was prepared in the same manner as in Example 7, except that the amounts of raw material powder were controlled such that the dielectric material prepared had a solid solution with the composition ratio of $91BaTiO_3.6BiLuO_3.3KNbO_3$.

Example 23: Preparation of $91BaTiO_3.6BiLuO_3.3NaNbO_3$ Dielectric Material

A dielectric material was prepared in the same manner as in Example 22, except that $Na_2CO_3$ was used instead of $K_2CO_3$, to obtain $NaNbO_3$ instead of $KNbO_3$.

Example 24: Preparation of $91BaTiO_3.6BiLuO_3.3RbNbO_3$ Dielectric Material

A dielectric material was prepared in the same manner as in Example 22, except that $Rb_2CO_3$ was used instead of $K_2CO_3$, to obtain $RbNbO_3$ instead of $KNbO_3$.

Comparative Example 1: Preparation of $BaTiO_3$ Dielectric Material

A dielectric material was prepared in the same manner as in Example 1, except that $BaCO_3$ and $TiO_2$ powder were weighed in amounts to obtain the stoichiometry of $BaTiO_3$.

Comparative Example 2: Preparation of $93BaTiO_3.7BiHoO_3$ Dielectric Material

A dielectric material was prepared in the same manner as in Example 1, except that $BaCO_3$, $TiO_2$, $Bi_2O_3$, and $Ho_2O_3$ powder were weighed in amounts to obtain the stoichiometry of $93BaTiO_3.7BiHoO_3$.

Comparative Example 3: Preparation of $92BaTiO_3.8BiHoO_3$ Dielectric Material

A dielectric material was prepared in the same manner as in Comparative Example 2, except that the amounts of the raw material powders were controlled to obtain the stoichiometry of $92BaTiO_3$-$8BiHoO_3$.

Comparative Example 4: Preparation of $90BaTiO_3.10BiHoO_3$ Dielectric Material

A dielectric material was prepared in the same manner as in Comparative Example 2, except that the amounts of the raw material powders were controlled to obtain the stoichiometry of $90BaTiO_3.10BiHoO_3$.

Comparative Example 5: Preparation of $93BaTiO_3.7BiTmO_3$ Dielectric Material

A dielectric material was prepared in the same manner as in Comparative Example 2, except that $Tm_2O_3$ was used instead of $Ho_2O_3$, to obtain $BiTmO_3$ instead of $BiHoO_3$.

Comparative Example 6: Preparation of $92BaTiO_3.8BiTmO_3$ Dielectric Material

A dielectric material was prepared in the same manner as in Comparative Example 5, except that the amounts of the raw material powders were controlled to obtain the stoichiometry of $92BaTiO_3.8BiTmO_3$.

Comparative Example 7: Preparation of $90BaTiO_3.10BiTmO_3$ Dielectric Material

A dielectric material was prepared in the same manner as in Comparative Example 5, except that the amounts of the raw material powders were controlled to obtain the stoichiometry of $90BaTiO_3$-$10BiTmO_3$.

Comparative Example 8: Preparation of $93BaTiO_3.7BiLuO_3$ Dielectric Material

A dielectric material was prepared in the same manner as in Comparative Example 2, except that $Lu_2CO_3$ was used instead of $Ho_2O_3$, to obtain $BiLuO_3$ instead of $BiHoO_3$.

Comparative Example 9: Preparation of $92BaTiO_3.8BiLuO_3$ Dielectric Material

A dielectric material was prepared in the same manner as in Comparative Example 8, except that the amounts of raw material powder were controlled to obtain the stoichiometry of $92BaTiO_3.8BiLuO_3$.

Comparative Example 10: Preparation of $90BaTiO_3.10BiLuO_3$ Dielectric Material A dielectric material was prepared in the same manner as in Comparative Example 8, except that the amounts of raw material powder were controlled to obtain the stoichiometry of $90BaTiO_3.10BiLuO_3$.

The solid solution compositions of the dielectric materials of Examples 1 to 24 and Comparative Examples 1 to 10 are represented in Table 1.

TABLE 1

| Example | composition | Abbreviation |
|---|---|---|
| Example 1 | $91BaTiO_3$•$8BiHoO_3$•$1KNbO_3$ | 91BT•8BH•1KN |
| Example 2 | $90BaTiO_3$•$8BiHoO_3$•$2KNbO_3$ | 90BT•8BH•2KN |
| Example 3 | $89BaTiO_3$•$8BiHoO_3$•$3KNbO_3$ | 89BT•8BH•3KN |
| Example 4 | $91BaTiO_3$•$8BiTmO_3$•$1KNbO_3$ | 91BT•8BT'•1KN |
| Example 5 | $90BaTiO_3$•$8BiTmO_3$•$2KNbO_3$ | 90BT•8BT'•2KN |
| Example 6 | $89BaTiO_3$•$8BiTmO_3$•$3KNbO_3$ | 89BT•8BT'•3KN |
| Example 7 | $91BaTiO_3$•$8BiLuO_3$•$1KNbO_3$ | 91BT•8BL•1KN |
| Example 8 | $90BaTiO_3$•$8BiLuO_3$•$2KNbO_3$ | 90BT•8BL•2KN |
| Example 9 | $89BaTiO_3$•$8BiLuO_3$•$3KNbO_3$ | 89BT•8BL•3KN |
| Example 10 | $91BaTiO_3$•$8BiTmO_3$•$1NaNbO_3$ | 91BT•8BT'•1NN |
| Example 11 | $90BaTiO_3$•$8BiTmO_3$•$2NaNbO_3$ | 90BT•8BT'•2NN |
| Example 12 | $89BaTiO_3$•$8BiTmO_3$•$3NaNbO_3$ | 89BT•8BT'•3NN |
| Example 13 | $91BaTiO_3$•$8BiTmO_3$•$1RbNbO_3$ | 91BT•8BT'•1RN |
| Example 14 | $90BaTiO_3$•$8BiTmO_3$•$2RbNbO_3$ | 90BT•8BT'•2RN |
| Example 15 | $89BaTiO_3$•$8BiTmO_3$•$3RbNbO_3$ | 89BT•8BT'•3RN |
| Example 16 | $91BaTiO_3$•$6BiHoO_3$•$3KNbO_3$ | 91BT•6BH•3KN |
| Example 17 | $91BaTiO_3$•$6BiHoO_3$•$3NaNbO_3$ | 91BT•6BH•3NN |
| Example 18 | $91BaTiO_3$•$6BiHoO_3$•$3RbNbO_3$ | 91BT•6BH•3RN |
| Example 19 | $91BaTiO_3$•$6BiTmO_3$•$3KNbO_3$ | 91BT•6BT'•3KN |
| Example 20 | $91BaTiO_3$•$6BiTmO_3$•$3NaNbO_3$ | 91BT•6BT'•3NN |
| Example 21 | $91BaTiO_3$•$6BiTmO_3$•$3RbNbO_3$ | 91BT•6BT'•3RN |
| Example 22 | $91BaTiO_3$•$6BiLuO_3$•$3KNbO_3$ | 91BT•6BL•3KN |
| Example 23 | $91BaTiO_3$•$6BiLuO_3$•$3NaNbO_3$ | 91BT•6BL•3NN |
| Example 24 | $91BaTiO_3$•$6BiLuO_3$•$3RbNbO_3$ | 91BT•6BL•3RN |
| Comparative Example 1 | $BaTiO_3$ | BT |
| Comparative Example 2 | $93BaTiO_3$•$7BiHoO_3$ | 93BT•7BH |
| Comparative Example 3 | $92BaTiO_3$•$8BiHoO_3$ | 92BT•8BH |
| Comparative Example 4 | $90BaTiO_3$•$10BiHoO_3$ | 90BT•10BH |
| Comparative Example 5 | $93BaTiO_3$•$7BiTmO_3$ | 93BT•7BT' |

TABLE 1-continued

| Example | composition | Abbreviation |
|---|---|---|
| Comparative Example 6 | $92BaTiO_3$•$8BiTmO_3$ | 92BT•8BT' |
| Comparative Example 7 | $90BaTiO_3$•$10BiTmO_3$ | 90BT•10BT' |
| Comparative Example 8 | $93BaTiO_3$•$7BiLuO_3$ | 93BT•7BL |
| Comparative Example 9 | $92BaTiO_3$•$8BiLuO_3$ | 92BT•8BL |
| Comparative Example 10 | $90BaTiO_3$•$10BiLuO_3$ | 90BT•10BL |

Evaluation Example 1: X-Ray Diffraction (XRD) Analysis of Dielectric Materials of Examples 1 to 9

Powder XRD spectra of the dielectric materials of Examples 1 to 9 and Comparative Examples 1 to 10 were measured with CuKα radiation. Each dielectric material was analyzed in pellet bulk form.

Figure 6A:
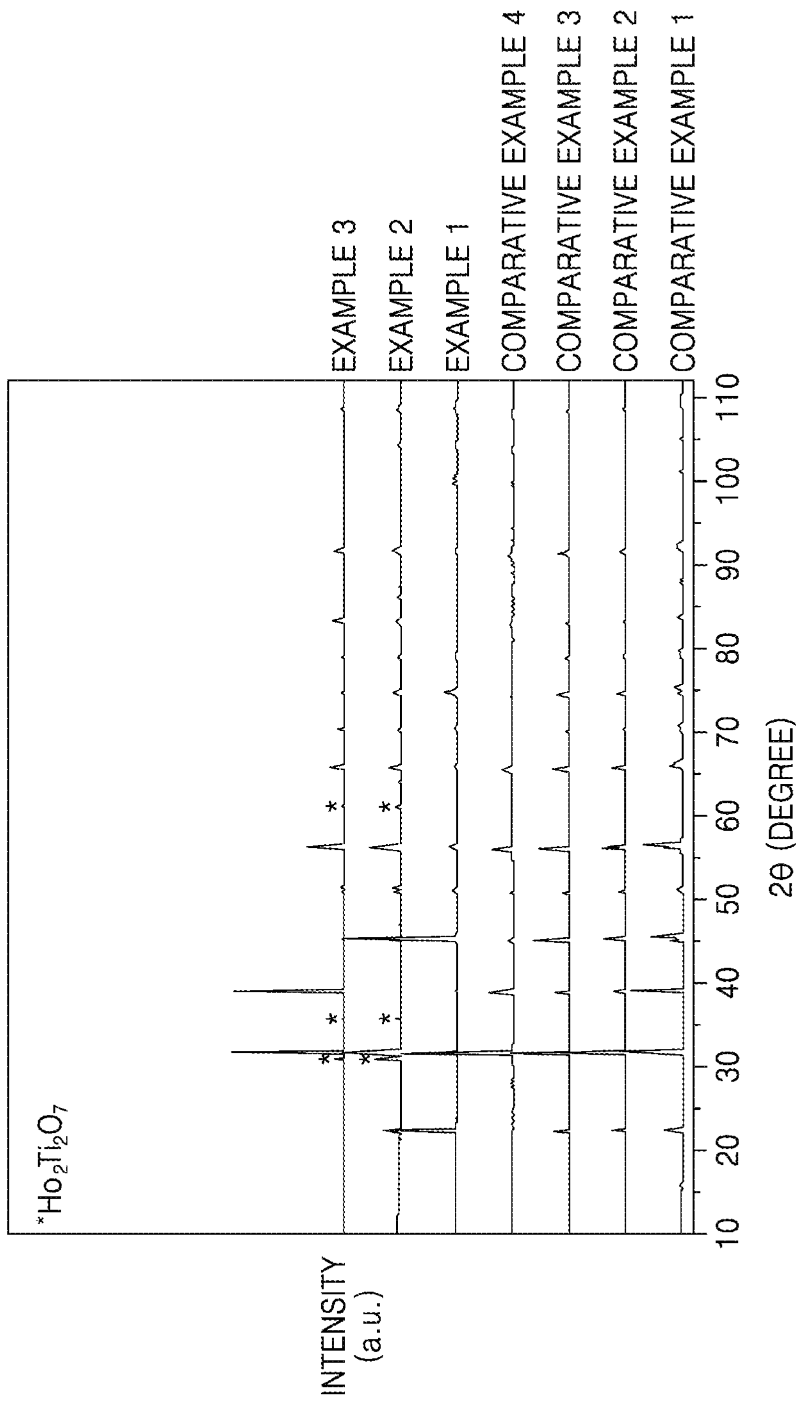
FIG. 6A illustrates X-ray diffraction (XRD) spectra of the entire angular range of dielectric materials of Examples 1 to 3 and Comparative Examples 1 to 4.
Figure 6B:
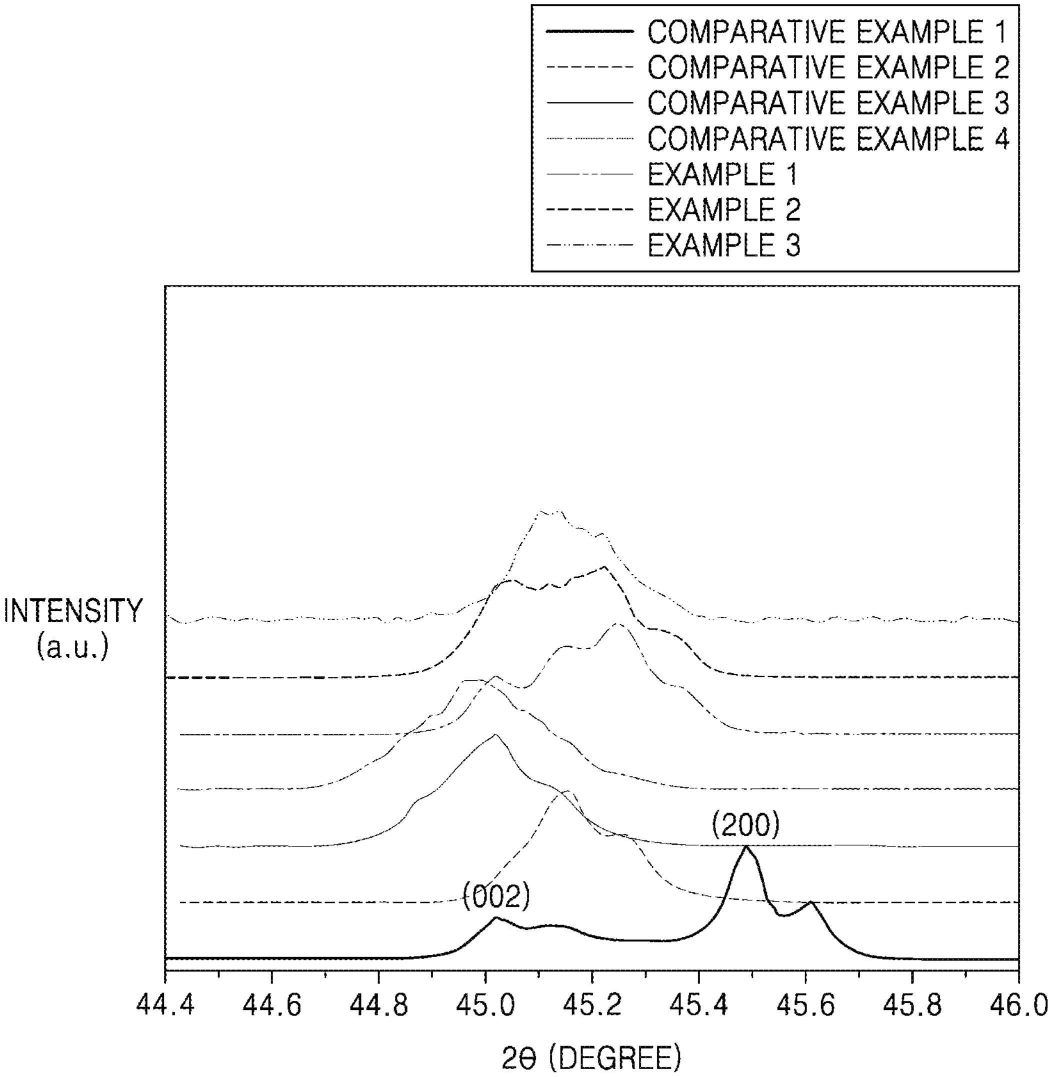
FIG. 6B is a magnified presentation of the XRD peaks in a low-angle range (2θ=44.4° to) 46.0° of FIG. 6A.

FIG. 6A illustrates XRD spectra of the dielectric materials of Examples 1 to 3 and Comparative Examples 1 to 4 over the entire angular range, and FIG. 6B is a magnified presentation of the XRD peaks in a low-angle range (2θ=44.4° to 46.0°) of FIG. 6A.

The dielectric materials of Examples 1 to 3 are solid solutions with $BiHoO_3$ and $KNbO_3$ as solid solutes, the dielectric materials of Comparative Examples 2 to 4 are solid solutions with only $BiHoO_3$ as a solid solute, and the dielectric material of Comparative Example 1 is $BaTiO_3$.

As shown in the spectra of FIG. 6A, the XRD patterns of the dielectric materials of Example 1 and Comparative Examples 2 to 4 match the diffraction pattern of the $BaTiO_3$ dielectric material of Comparative Example 1. This indicates that the dielectric materials of Example 1 and Comparative Examples 2 to 4 have a single phase like $BaTiO_3$. Meanwhile, referring to FIG. 6A, the dielectric materials of Examples 2 and 3 including a relatively high concentration of $KNbO_3$ have similar diffraction patterns to the $BaTiO_3$ dielectric material of Comparative Example 1, but also form a secondary phase of $Ho_2Ti_2O_7$ as denoted by asterisk (*). The formation of this secondary phase is considered to be attributed to the reaction of Ti and Ho, which is a rare earth element located at the site of Ti, due to volatilization of K during the sintering process at a relatively high temperature of 1400° C. The formation of the secondary phase can be suppressed at a relatively low temperature of about 1250° C. or less, which is a temperature applied in an MLCC manufacturing process.

Referring to FIG. 6B, the $BaTiO_3$ dielectric material of Comparative Example 1 exhibits two peaks, which correspond to the (002) and (200) crystal planes, respectively, at near 45.0° and 45.5°, indicating a tetragonal crystal structure. Meanwhile, in the dielectric materials of Examples 1 to 3 and Comparative Examples 2 to 4, a single wide peak is observed between 44.7° and 45.5°, while no peak at or near 45.5° corresponding to the (200) crystal plane appears. This indicates that the dielectric materials of Examples 1 to 3 and Comparative Examples 2 to 4 underwent, through a solid solution, a pseudo-cubic process in which the crystal structure changes from a tetragonal structure to a cubic structure. A pseudo-cubic means a crystal close to the cubic structure with a ratio of the a-axis to the c-axis of the crystal that is close to 1.

Figure 7A:
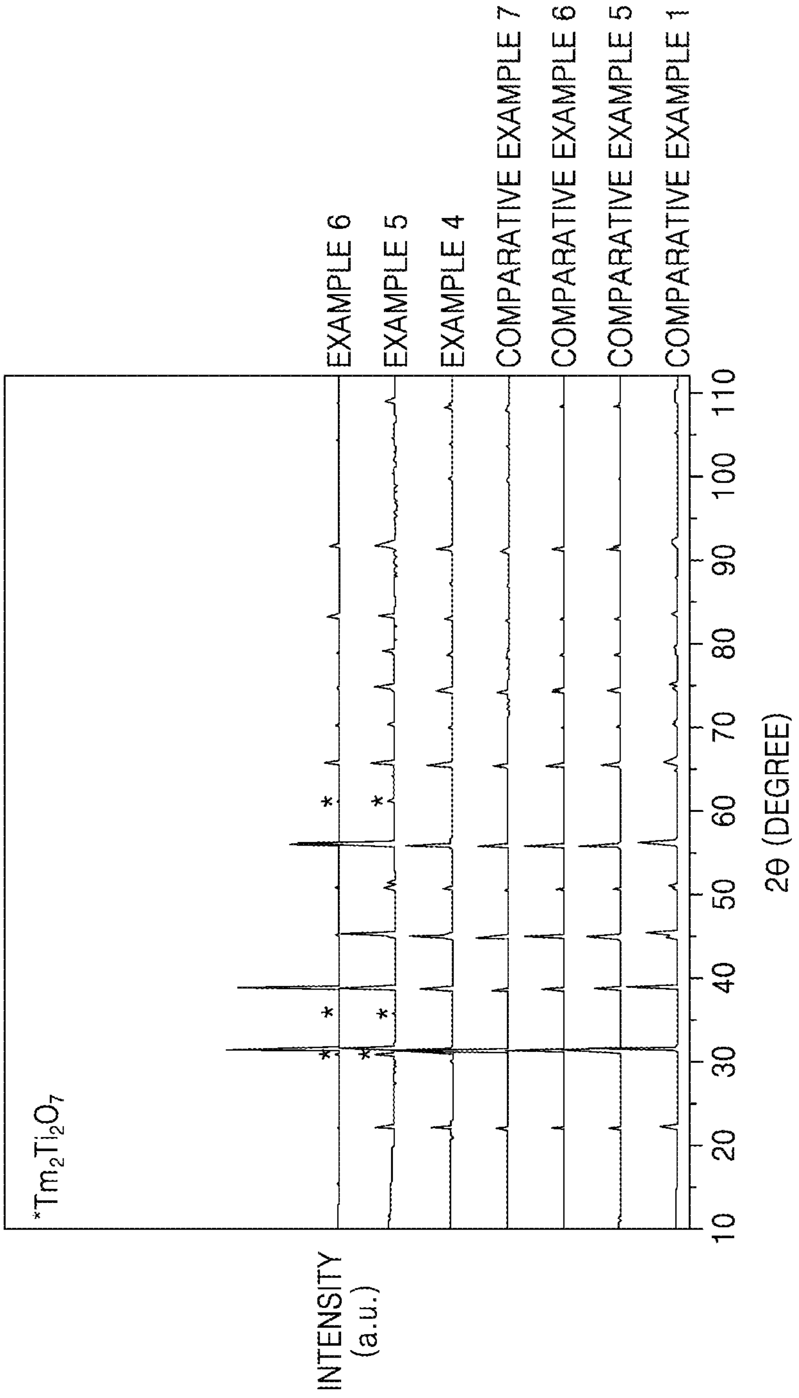
FIG. 7A illustrates XRD spectra of the entire angular range of dielectric materials of Examples 4 to 6 and Comparative Examples 1 and 5 to 7.
Figure 7B:
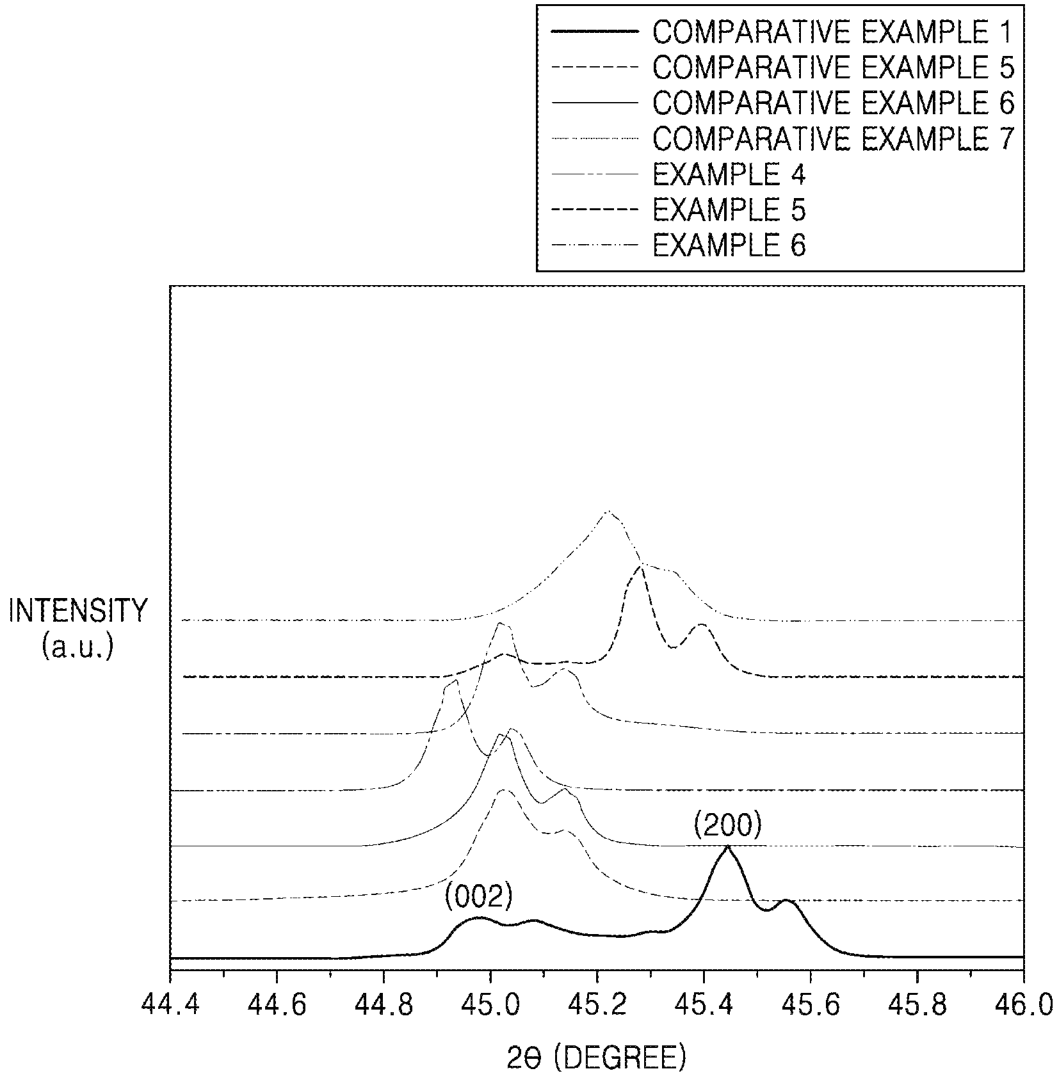
FIG. 7B is a magnified presentation of the XRD peaks in a low-angle range (2θ=44.4° to) 46.0° of FIG. 7A.

FIG. 7A illustrates XRD spectra of the dielectric materials of Examples 4 to 6 and Comparative Examples 1 and 5 to 7 over the entire angular range, and FIG. 7B is a magnified presentation of the XRD peaks in a low-angle range (2θ=44.4° to) 46.0° of FIG. 7A.

The dielectric materials of Examples 4 to 6 are solid solutions including $BiTmO_3$ and $KNbO_3$ as solid solutes, and the dielectric materials of Comparative Examples 5 to 7 are solid solutions with only $BiTmO_3$ as a solid solute.

Referring to the spectra of FIG. 7A, as in the spectra of FIG. 6A, the diffraction patterns of the dielectric materials of Example 4 and Comparative Examples 5 to 7 match the diffraction pattern of the $BaTiO_3$ dielectric material of Comparative Example 1. This indicates that the dielectric materials of Example 4 and Comparative Examples 5 to 7 have single phases, like $BaTiO_3$. Meanwhile, referring to FIG. 7A, the dielectric materials of Examples 5 and 6, including a relatively high concentration of $KNbO_3$, have similar diffraction patterns to the $BaTiO_3$ dielectric material of Comparative Example 1, but a trace amount of a secondary phase of $Tm_2Ti_2O_7$ (denoted by asterisk (*)) is present therein. The formation of this secondary phase occurs at a high sintering temperature in the same manner as in FIG. 6A, and can be suppressed at a relatively low temperature of about 1250° C., which is a process temperature at which a MLCC may be-manufactured.

Referring to FIG. 7B, in the dielectric materials of Examples 4 to 6 and the dielectric materials of Comparative Examples 5 to 7, a peak corresponding to the (200) crystal plane is observed, while no peak corresponding to the (002) crystal plane appears. This indicates that in the dielectric materials of Examples 5 to 7 and Comparative Examples 2 to 4, the crystal structure became, by the solid solution, pseudo-cubic in a change from a tetragonal structure to a cubic structure.

Figure 8A:
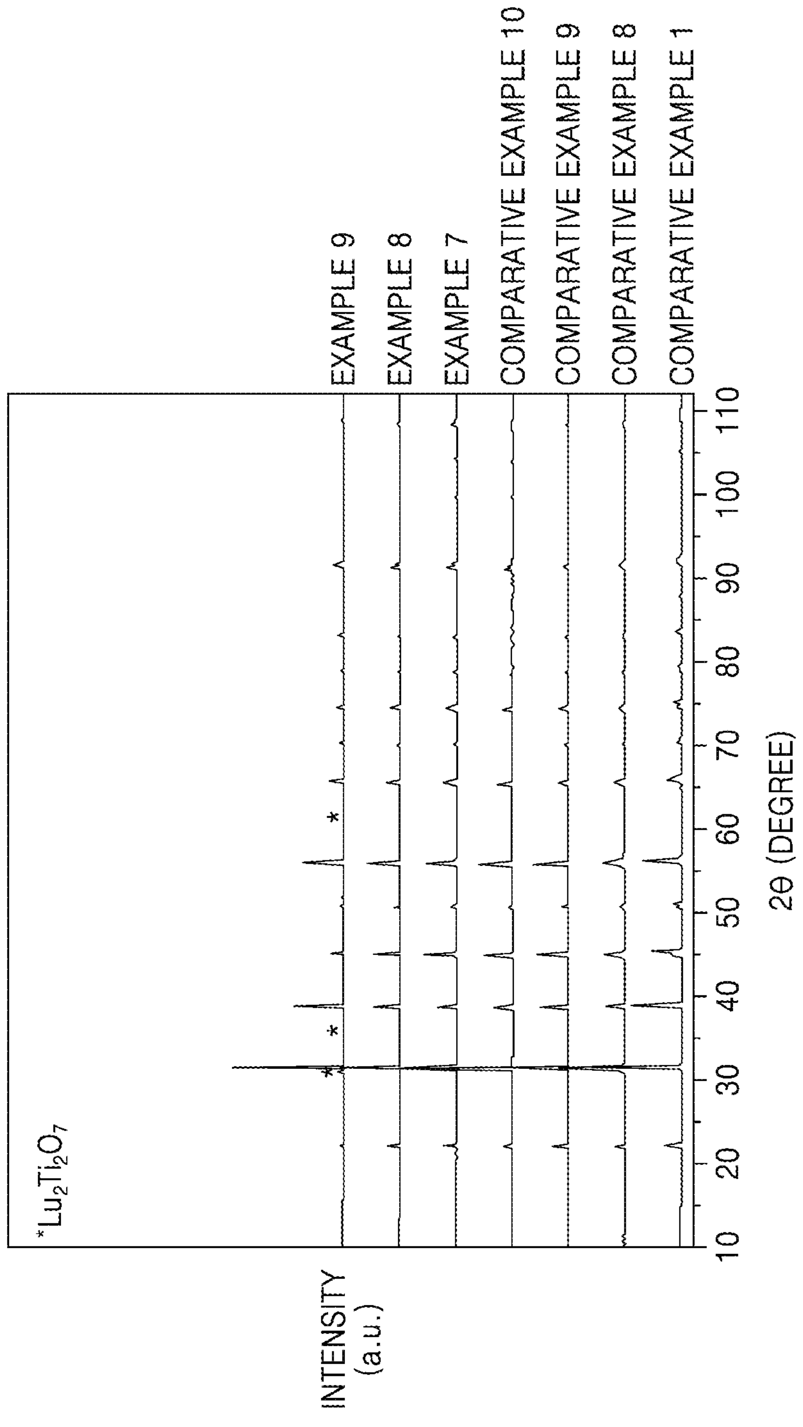
FIG. 8A illustrates XRD spectra of the entire angular range of dielectric materials of Examples 7 to 9 and Comparative Examples 1 and 8 to 10.
Figure 8B:
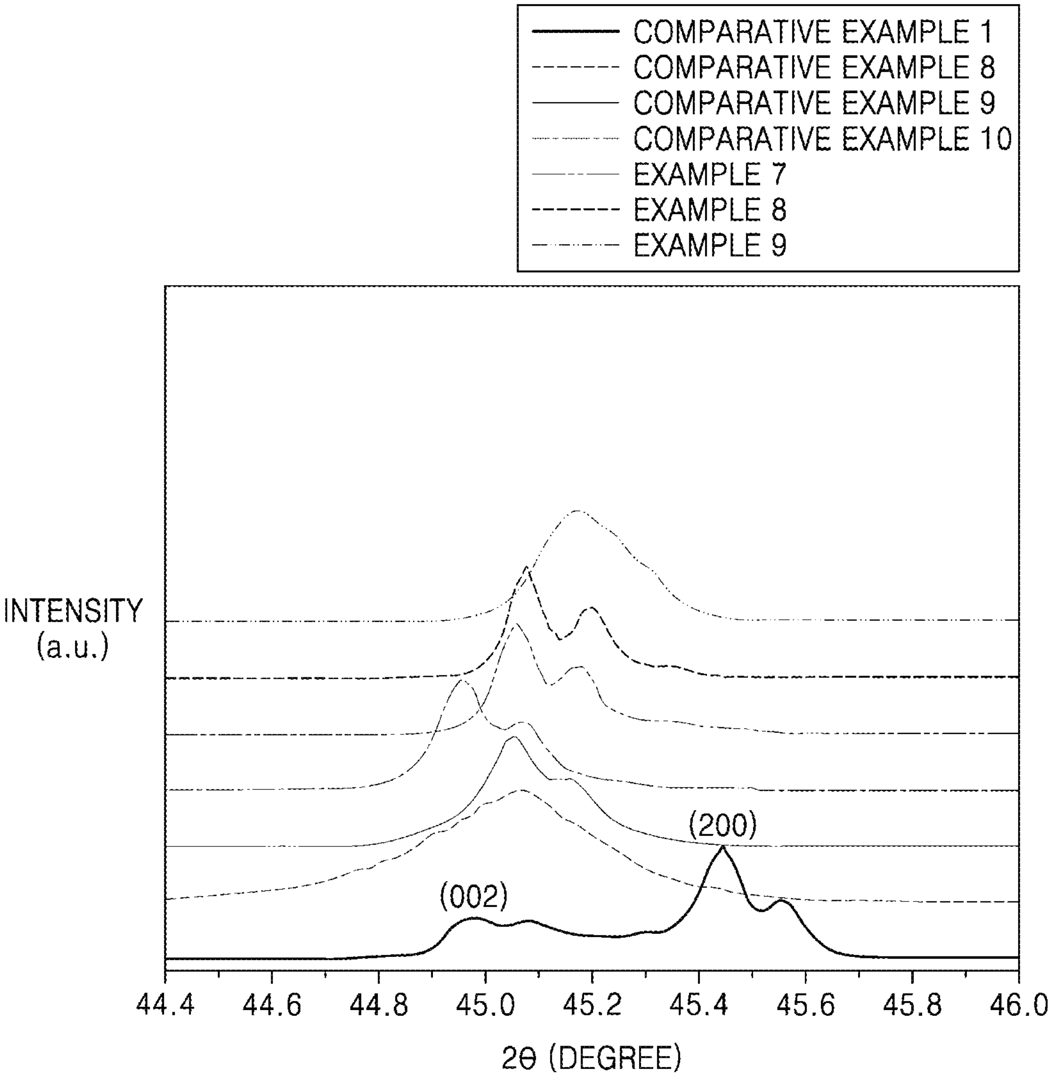
FIG. 8B is a magnified presentation of the XRD peaks in a low-angle range (2θ=44.4° to) 46.0° of FIG. 8A.

FIG. 8A illustrates XRD spectra of the dielectric materials of Examples 7 to 9 and Comparative Examples 1 and 8 to 10 over the entire angular range, and FIG. 8B is a magnified presentation of the XRD peaks in in low-angle range (2θ=44.4° to) 46.0° of FIG. 8A.

The dielectric materials of Examples 7 to 9 are solid solutions with $BiLuO_3$ and $KNbO_3$ as solid solutes, and the dielectric materials of Comparative Examples 8 to 10 are solid solutions with only $BiLuO_3$ as a solid solute.

Referring to the spectra of FIG. 8A, as in the spectra of FIG. 6A, the diffraction patterns of the dielectric materials of Examples 7 and 8 and Comparative Examples 8 to 10 match the diffraction pattern of the $BaTiO_3$ dielectric material of Comparative Example 1. This indicates that the dielectric materials of Examples 7 and 8 and Comparative Examples 8 to 10 have single phases, like $BaTiO_3$. Meanwhile, referring to FIG. 8A, in the dielectric material of Example 9, including a relatively high concentration of $KNbO_3$, a small amount of a secondary phase of $Lu_2Ti_2O_7$ is present therein as in FIGS. 6A and 7A. The formation of this secondary phase can be suppressed at a relatively low temperature of about 1250° C., which is a process temperature at which a MLCC may be manufactured.

Referring to FIG. 8B, in the dielectric materials of Examples 7 to 9 and Comparative Examples 8 to 10, only a peak corresponding to the (200) crystal plane is present, while no peak corresponding to the (002) crystal plane appears. This indicates that in the dielectric materials of Examples 7 to 9 and Comparative Examples 8 to 10, the crystal structure became, by a solid solution, pseudo-cubic in a change from a tetragonal structure to a cubic structure.

Evaluation Example 2: Permittivity According to Electric Field of Dielectric Materials of Examples 1 to 9

Figure 9A:
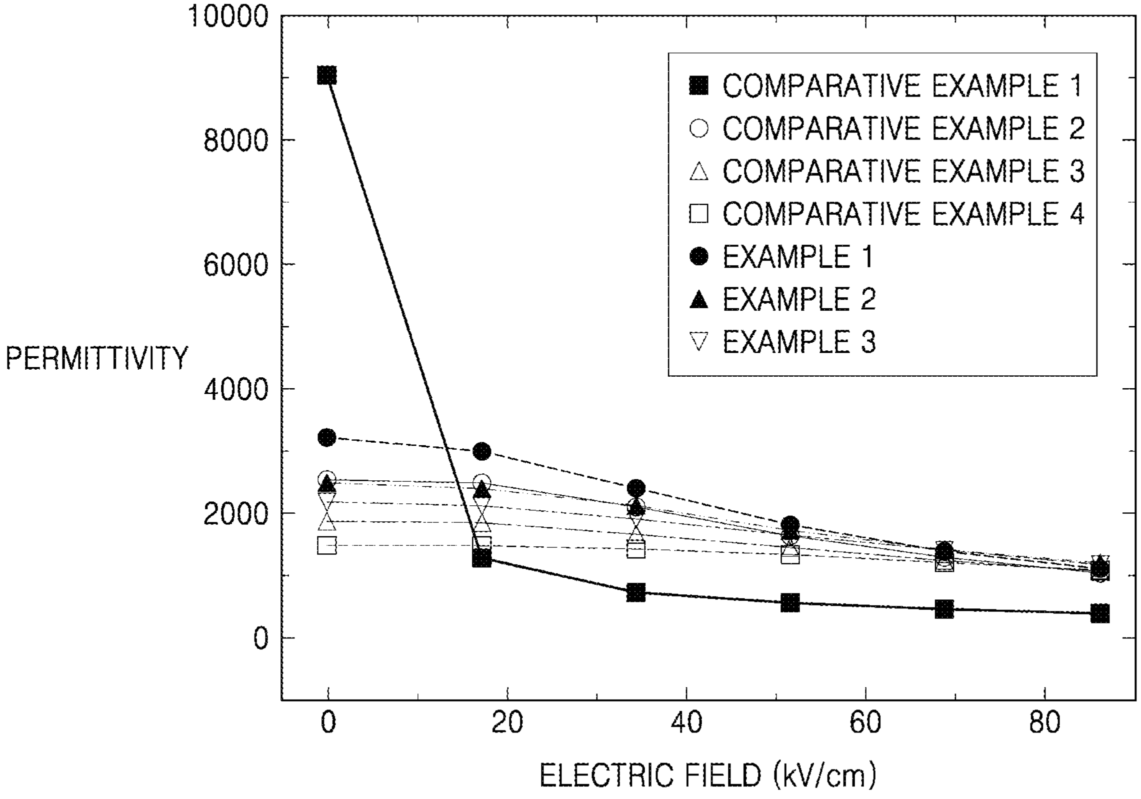
FIG. 9A is a graph of permittivity according to electric field in the dielectric materials of Examples 1 to 3 and Comparative Examples 1 to 4.
Figure 9B:
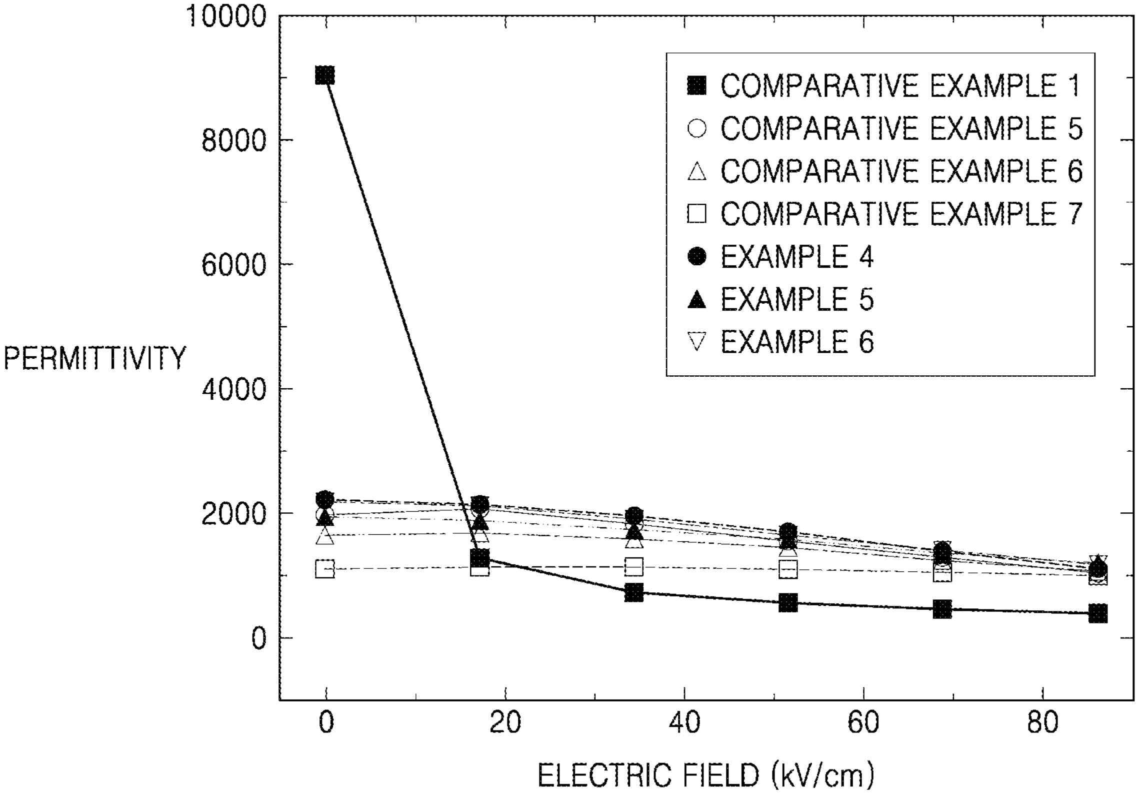
FIG. 9B is a graph of permittivity according to electric field in the dielectric materials of Examples 4 to 6 and Comparative Examples 1 and 5 to 7.
Figure 9C:
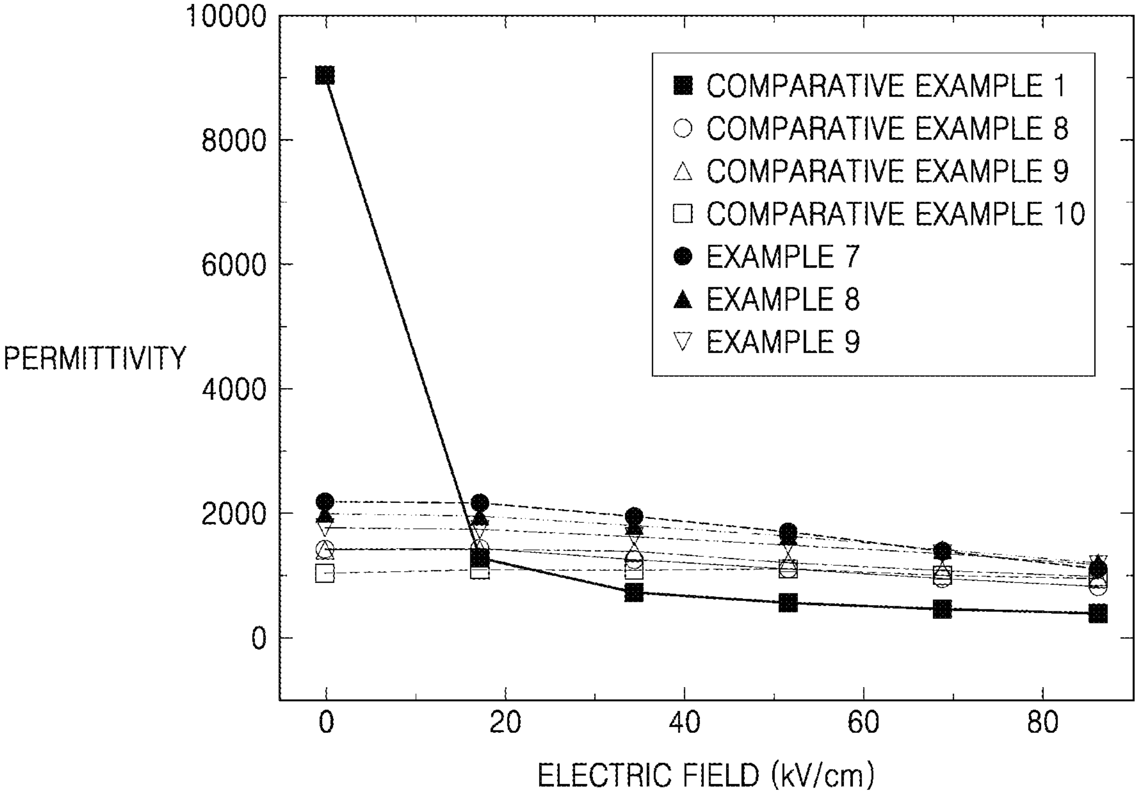
FIG. 9C is a graph of permittivity according to electric field in the dielectric materials of Examples 7 to 9 and Comparative Examples 1 and 8 to 10.

FIG. 9A is a graph of permittivity according to electric field of the dielectric materials of Examples 1 to 3 and Comparative Examples 1 to 4, FIG. 9B is a graph of permittivity according to electric field of the dielectric materials of Examples 4 to 6 and Comparative Examples 1 and 5 to 7, and FIG. 9C is a graph of permittivity according to electric field of the dielectric materials of Examples 7 to 9 and Comparative Examples 1 and 8 to 10.

Referring to FIGS. 9A, 9B, and 9C, the permittivity of the $BaTiO_3$ dielectric material of Comparative Example 1 decreases rapidly as the electric field increases, while the permittivities of the dielectric materials of Comparative Examples 2 to 10 and Examples 1 to 9 decrease gradually as the electric field increases. In addition, the $BaTiO_3$ dielectric material of Comparative Example 1 has a low permittivity of 500 or less at a highest applied electric field of 87 kV/cm, while the dielectric materials as solid solutions of Comparative Examples 2 to 10 and Examples 1 to 9 have a high permittivity of 900 or more at the highest applied electric field of 87 kV/cm.

In addition, referring to FIGS. 9A, 9B, and 9C, the dielectric materials of Examples 1 to 9 generally exhibit higher permittivities in the most range of electric fields, as compared to the dielectric materials of Comparative Examples 2 to 10. This is considered to result from the dielectric materials of Comparative Examples 2 to 10 having mono polar nanoregions (PNR), while the dielectric materials of Examples 1 to 9 have multiple PNRs including the first solid solute and the second solid solute.

Evaluation Example 3: Permittivity of Dielectric Materials of Examples 1 to 9 with Respect to Solid Solute Concentration FIG. 10A is a comparative graph of permittivity of the dielectric materials of Examples 1 to 3 and Comparative Examples 1 to 4 in an electric field of 87 kV/cm, FIG. 10B is a comparative graph of permittivity of the dielectric materials of Examples 4 to 6 and Comparative Examples 1 and 5 to 7 in an electric field of 87 kV/cm, and FIG. 10C is a comparative graph of permittivity of the dielectric materials of Examples 7 to 9 and Comparative Examples 1 and 8 to 10 in an electric field of 87 kV/cm.

Figure 10A:
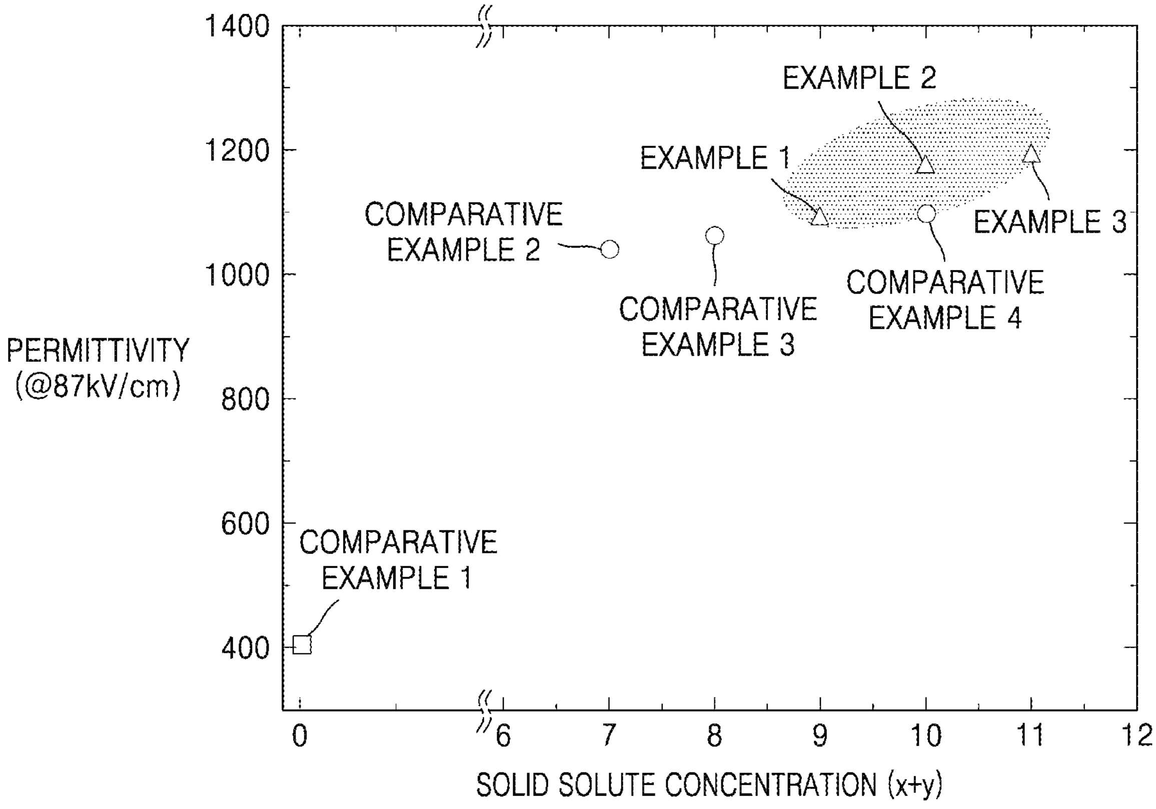
FIG. 10A is a comparative graph of permittivity of the dielectric materials of Examples 1 to 3 and Comparative Examples 1 to 4 in an electric field of 87 kV/cm.
Figure 10B:
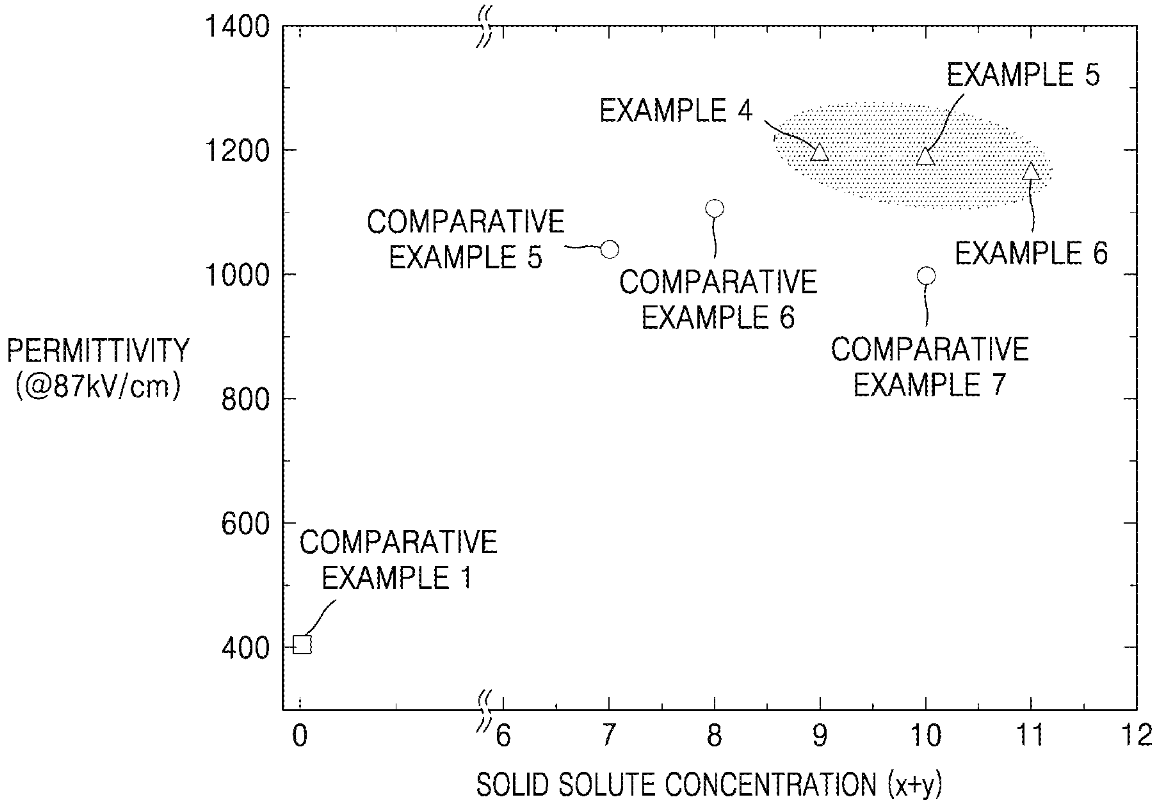
FIG. 10B is a comparative graph of permittivity of the dielectric materials of Examples 4 to 6 and Comparative Examples 1 and 5 to 7 in an electric field of 87 kV/cm.
Figure 10C:
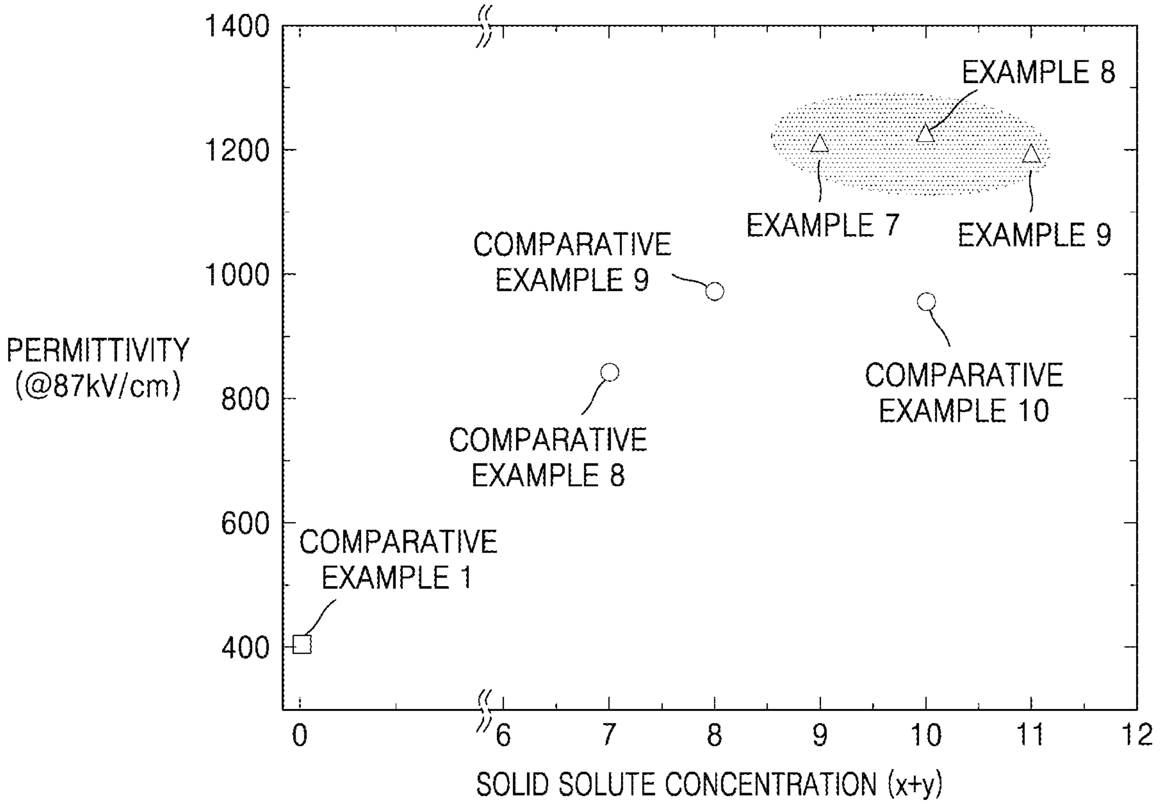
FIG. 10C is a comparative graph of permittivity of the dielectric materials of Examples 7 to 9 and Comparative Examples 1 and 8 to 10 in an electric field of 87 kV/cm.

Referring to FIGS. 10A, 10B, and 10C, the dielectric materials of Comparative Examples 2 to 10 have a solid solute concentration (x+y) of 7 mol %, 8 mol %, or 10 mol %, and the dielectric materials of Examples 1 to 9 have a solid solute concentration (x+y) of 9 mol %, 10 mol %, or 11 mol %. Mostly the dielectric materials of Examples 2 to 9 have a higher permittivity than the dielectric materials of Comparative Examples 1 to 10, except that the dielectric material of Example 1 having a solid solute concentration of 9 mol % has a similar permittivity to the dielectric material of Comparative Example 4 having a solid solute concentration of 10 mol %.

Evaluation Example 4: Polarization Behavior Measurement on Dielectric Materials of Examples 1 to 9

Figure 11A:
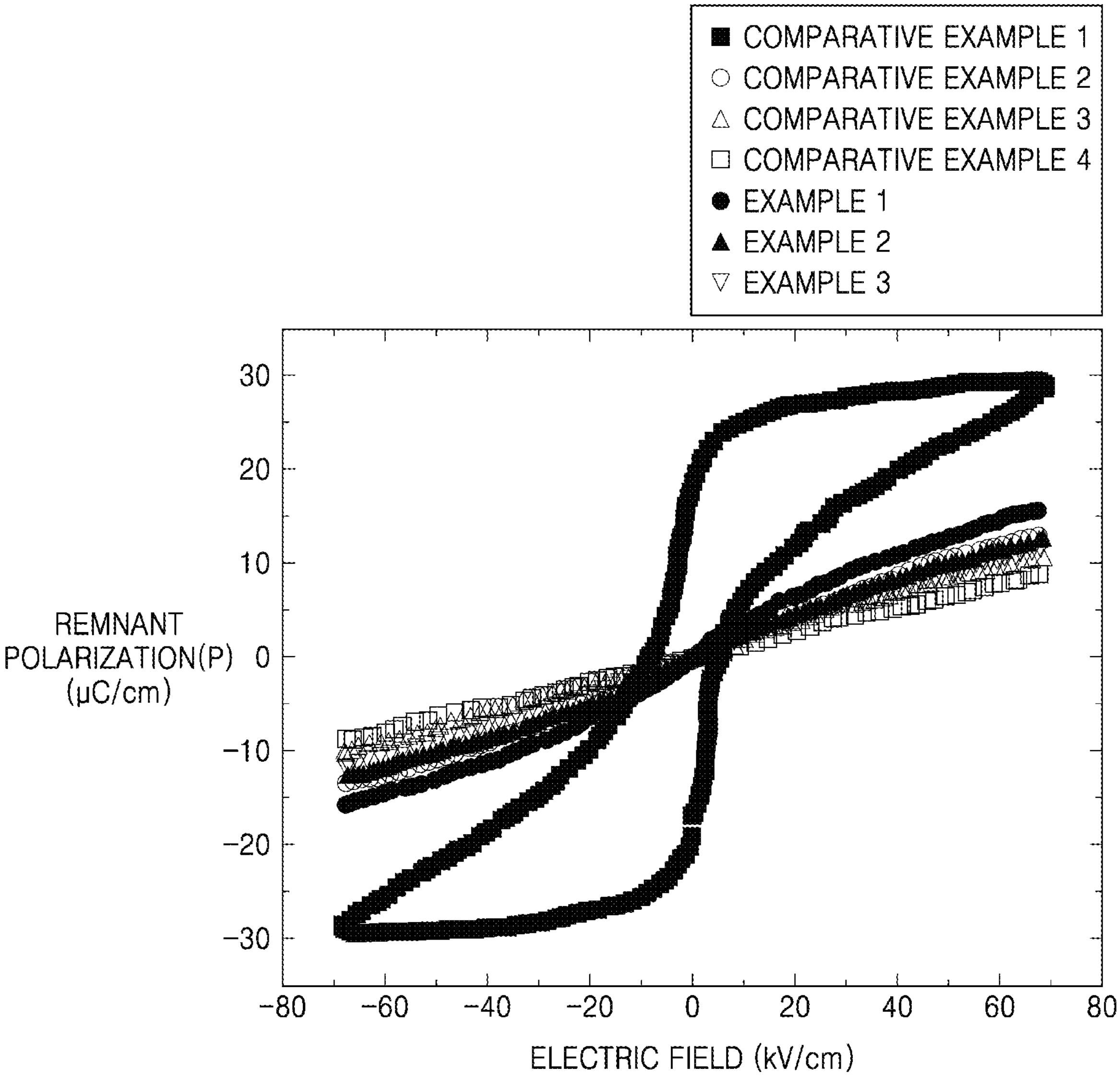
FIG. 11A illustrates hysteresis loops from the measurement of polarization behavior according to change in electric field of the dielectric materials of Examples 1 to 3 and Comparative Examples 1 to 4.
Figure 11B:
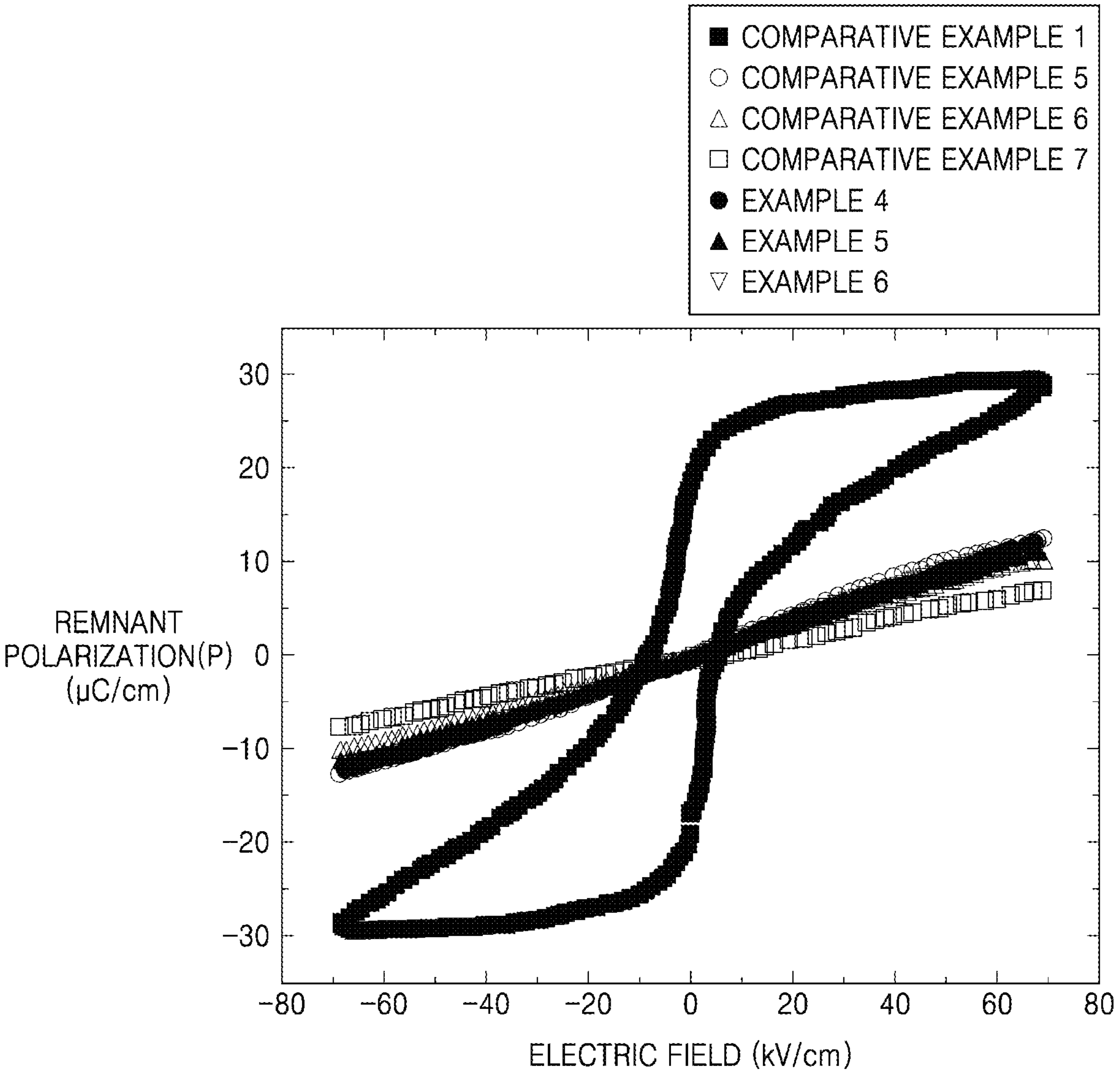
FIG. 11B illustrates hysteresis loops of the dielectric materials of Examples 4 to 6 and Comparative Examples 1 and 5 to 7.
Figure 11C:
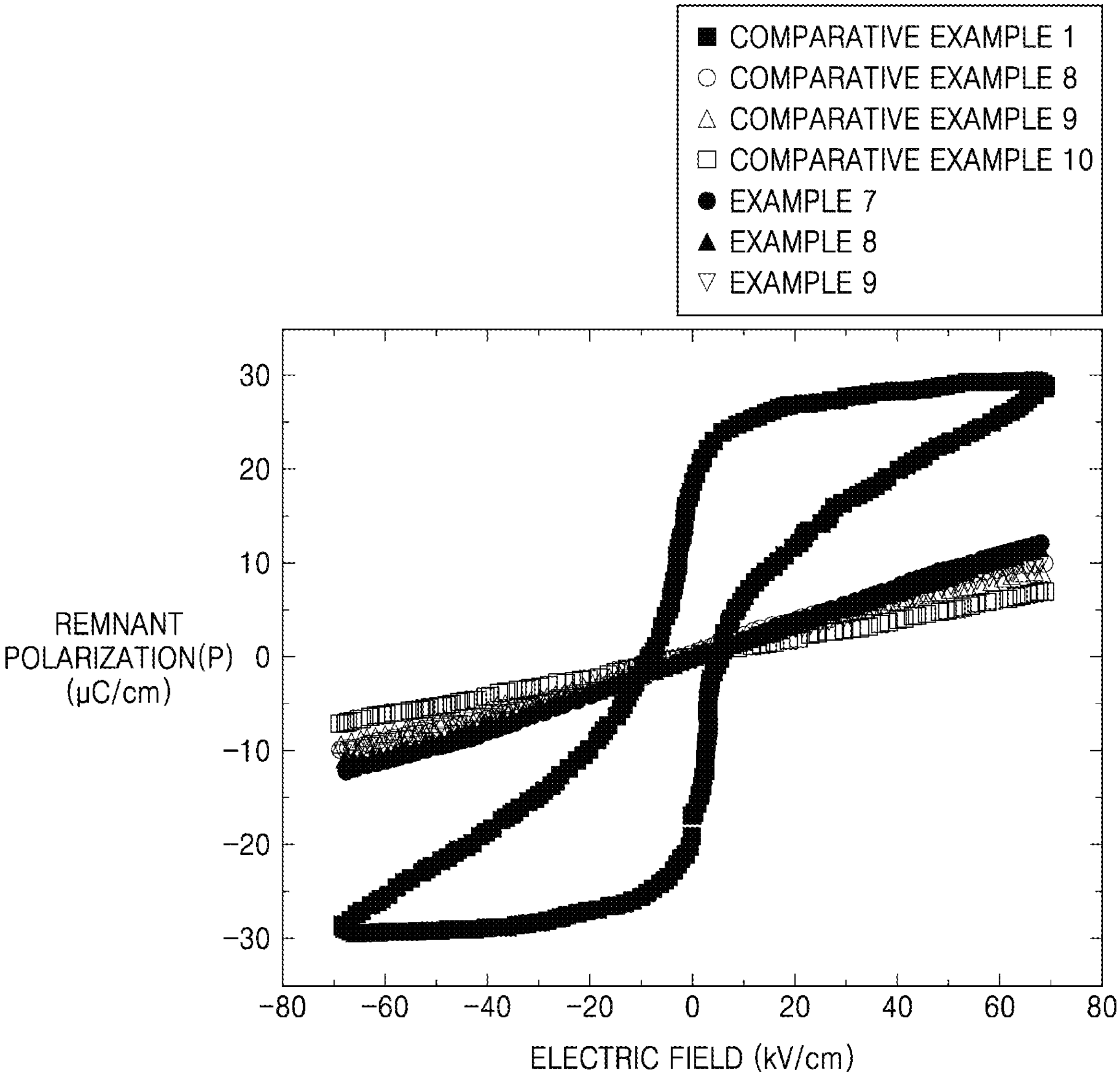
FIG. 11C illustrates hysteresis loops of the dielectric materials of Examples 7 to 9 and Comparative Examples 1 and 8 to 10.

FIG. 11A illustrates hysteresis loops from the measurement of polarization behavior according to change in electric field of the dielectric materials of Examples 1 to 3 and Comparative Examples 1 to 4, FIG. 11B illustrates hysteresis loops of the dielectric materials of Examples 4 to 6 and Comparative Examples 1 and 5 to 7, and FIG. 11C illustrates hysteresis loops of the dielectric materials of Examples 7 to 9 and Comparative Examples 1 and 8 to 10.

Referring to FIGS. 11A, 11B, and 11C, the $BaTiO_3$ dielectric material of Comparative Example 1 exhibits a typical hysteresis loop of ferroelectric material, while the dielectric materials of Comparative Examples 2 to 10 including single polar nanoregions and the dielectric materials of Examples 1 to 9 including double polar nanoregions exhibit hysteresis loops close to those of paraelectric material. The higher the solid solute concentration the dielectric materials have, the more horizontal the hysteresis loops appear. This is considered to be due to the dielectric materials of Comparative Examples 2 to 10 and Examples 1 to 9 becoming, by a solid solution, pseudo-cubic in a change from a tetragonal structure to a cubic structure.

Evaluation Example 5: XRD Analysis of Dielectric Materials of Examples 10 to 15

Figure 12A:
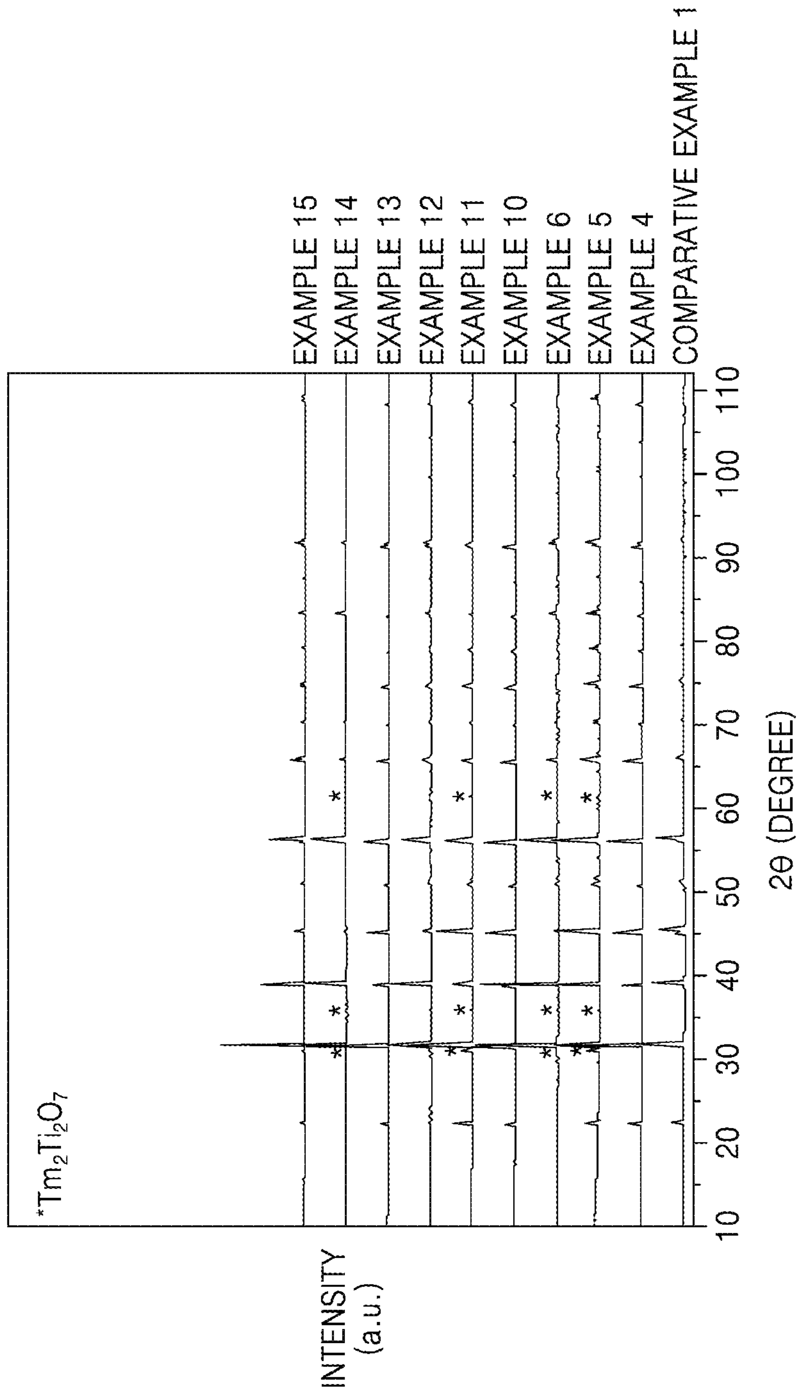
FIG. 12A illustrates XRD spectra of the entire angular range of the dielectric materials of Examples 4 to 6 and 10 to 15 and Comparative Example 1.
Figure 12B:
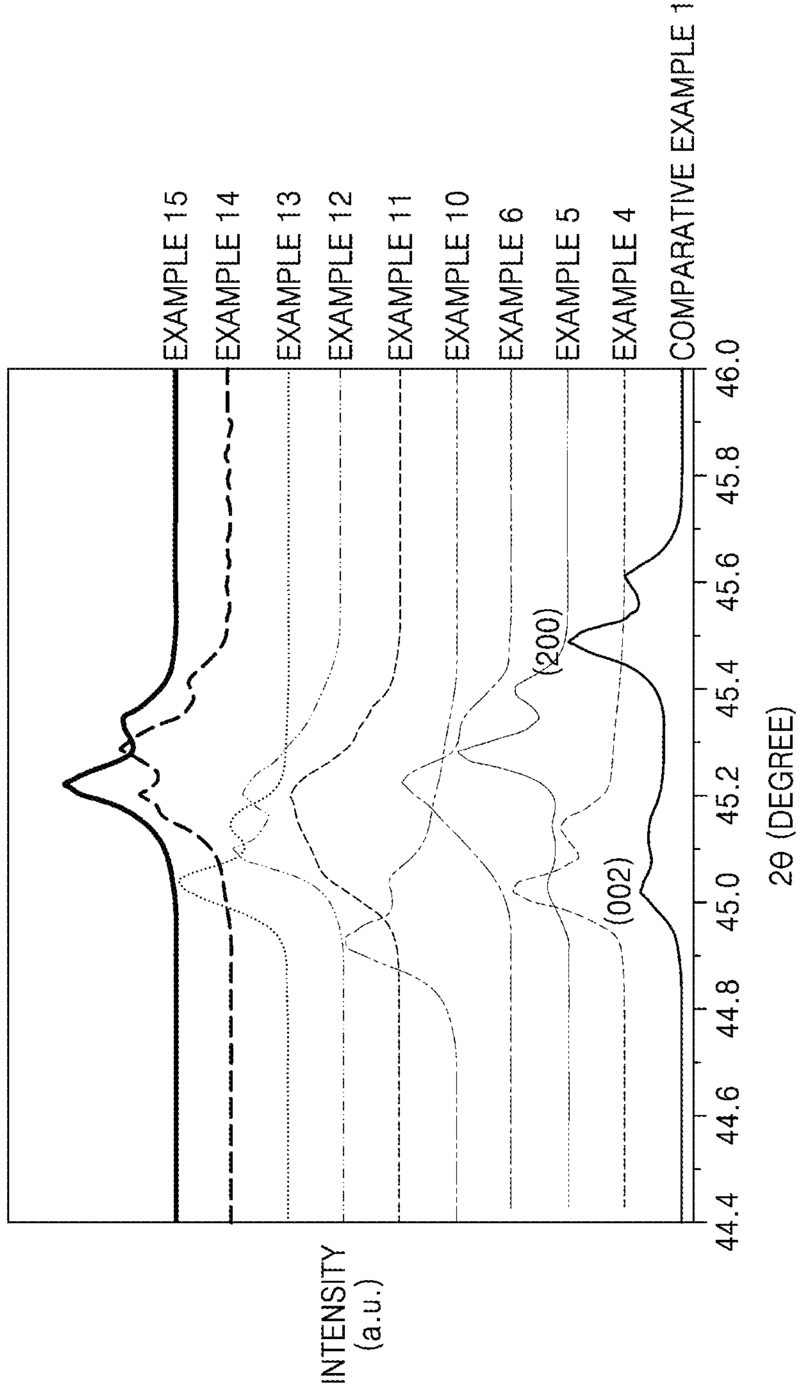
FIG. 12B is a magnified presentation of the XRD peaks in a low-angle range (2θ=44.4° to 46.0°) of FIG. 12A.

FIG. 12A illustrates XRD spectra of the dielectric materials of Examples 10 to 15 and Comparative Example 1 over the entire angular range, and FIG. 12B is a magnified presentation of the XRD peaks in a low-angle range (2θ=44.4° to 46.0°) of FIG. 12A. In FIGS. 12A and 12B, XRD spectra of the dielectric materials of Examples 4 to 6 are shown together. The dielectric materials of Examples 4 to 6 and 10 to 15 each include $BiTmO_3$ as a solid solute.

Referring to the spectra of FIG. 12A, the diffraction patterns of the dielectric materials of Examples 4, 10, and 13 match the diffraction pattern of the $BaTiO_3$ dielectric material of Comparative Example 1, indicating that a single phase was formed. Meanwhile, in FIG. 12A, as the concentrations $KNbO_3$, $NaNbO_3$, or $RbNbO_3$ solid solution increases, a secondary phase of $Tm_2Ti_2O_7$ is formed. The formation of this secondary phase can be suppressed at a relatively low temperature of about 1250° C., which is a process temperature at which a MLCC may be manufactured.

Referring to FIG. 12B, in the dielectric materials of Examples 10 to 15, no peak corresponding to the (002) crystal plane appears, indicating that the crystal structure became, by a solid solution, pseudo-cubic in a change from a tetragonal structure to a cubic structure.

Evaluation Example 6: Comparison of Permittivity According to Electric Field in Dielectric Materials of Examples 4 to 6 and 10 to 15

Figure 13A:
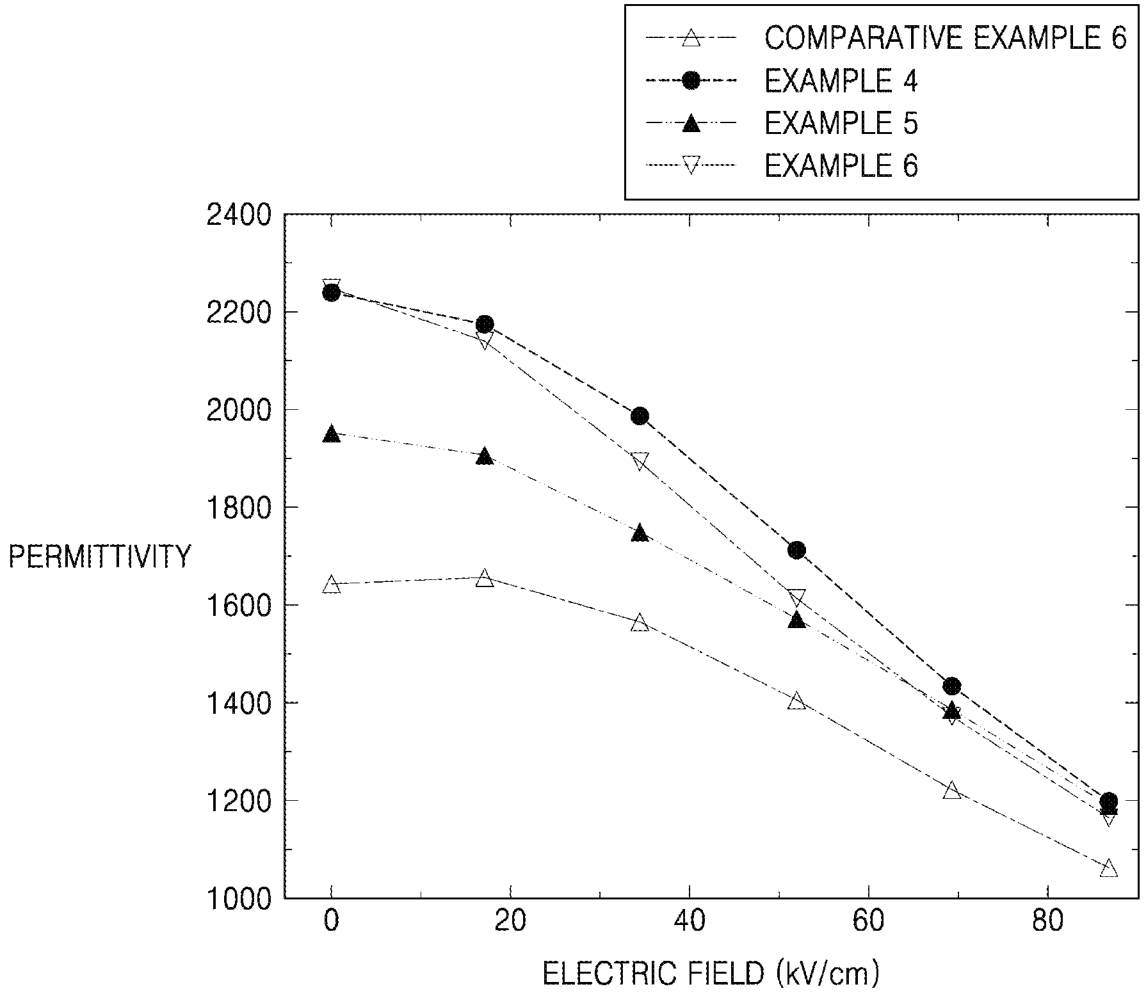
FIG. 13A is a graph of permittivity of the dielectric materials of Examples 4 to 6 and Comparative Example 6 according to electric field.
Figure 13B:
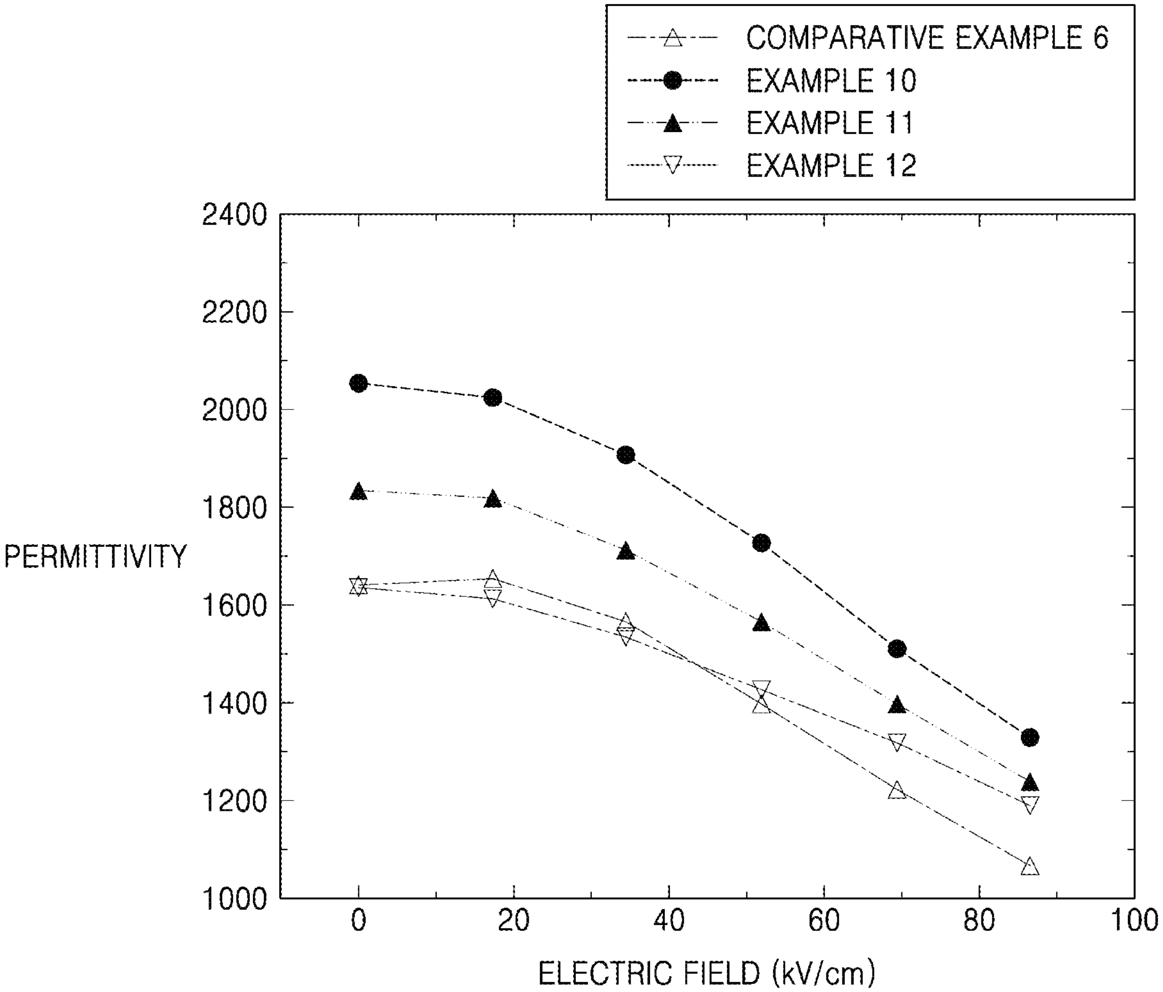
FIG. 13B is a graph of permittivity of the dielectric materials of Examples 10 to 12 and Comparative Example 6 according to electric field.
Figure 13C:
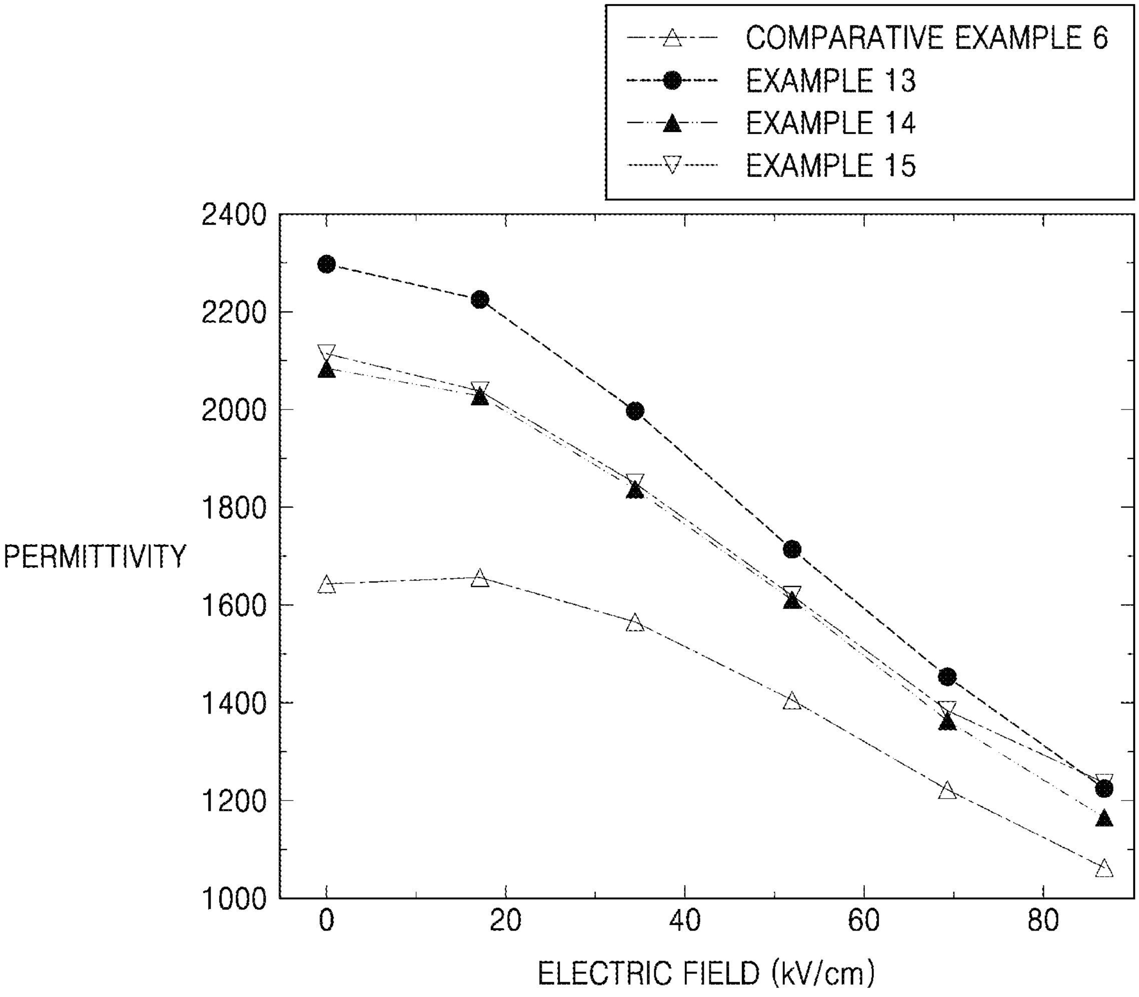
FIG. 13C is a graph of permittivity of the dielectric materials of Examples 13 to 15 and Comparative Example 6 according to electric field.

FIG. 13A is a graph of permittivity according to electric field in the dielectric materials of Examples 4 to 6 and Comparative Example 6, FIG. 13B is a graph of permittivity according to electric field in the dielectric materials of Examples 10 to 12 and Comparative Example 6, and FIG. 13C is a graph of permittivity according to electric field in the dielectric materials of Examples 13 to 15 and Comparative Example 6.

Referring to FIGS. 13A, 13B, and 13C, it is found that the permittivity according to electric field in the dielectric materials of Examples 4 to 6 and 10 to 15 including, along with $BiTmO_3$ as a first solid solute and $KNbO_3$, $NaNbO_3$, and/or $RbNbO_3$ as a second solid solute, is higher than the permittivity according to electric field in the dielectric material of Comparative Example 6 including only $BiTmO_3$ as a first solid solute in the most range of electric fields.

Evaluation Example 7: Relationship Between Tolerance Factor and Effective Permittivity in the Dielectric Materials of Examples 4 to 6 and 10 to 15

Figure 14:
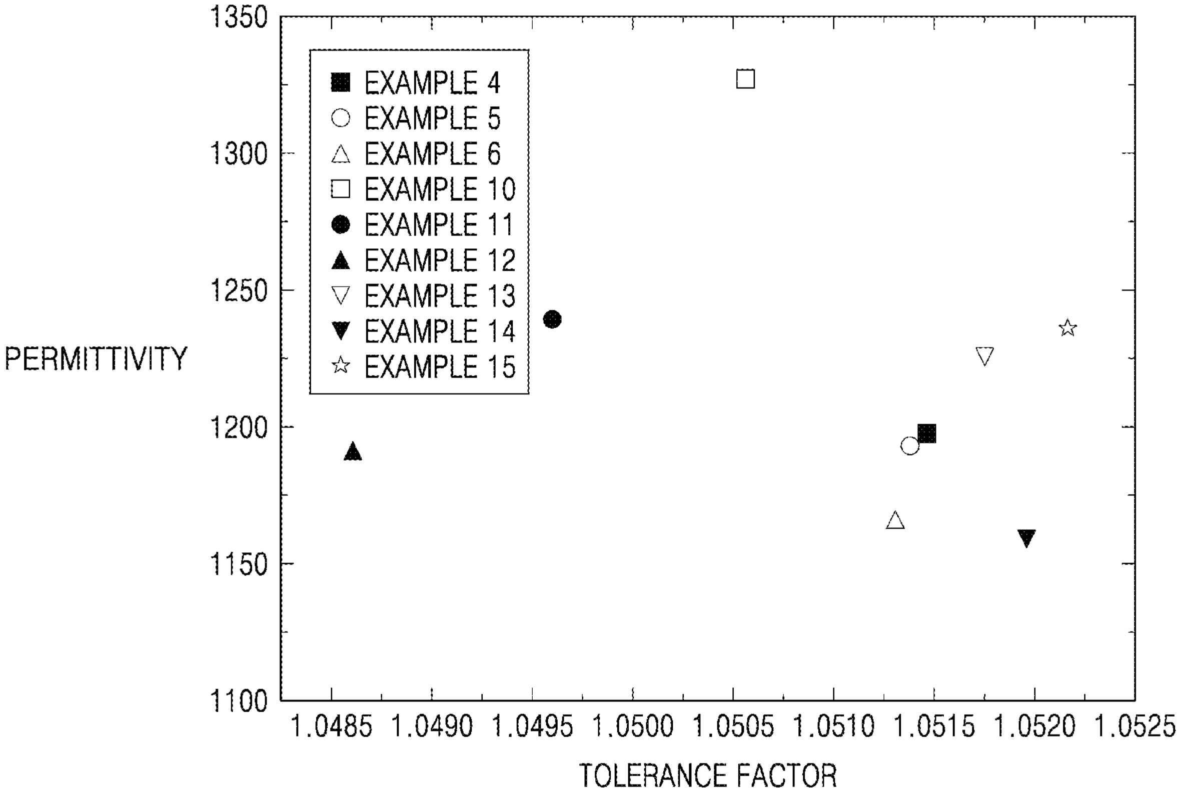
FIG. 14 is a graph illustrating effective permittivity at 87 kV/cm according to tolerance factor of the dielectric materials of Examples 4 to 6 and 10 to 15.

FIG. 14 is a graph illustrating effective permittivity at 87 kV/cm according to a tolerance factor of the dielectric materials of Examples 4 to 6 and 10 to 15. Tolerance factor (t), which is an index representing a measure of structural change in $ABO_3$ perovskite crystals, is expressed by equation (1).

$$t = \frac{r_A + r_O}{\sqrt{2}\,(r_B + r_O)} \quad (1)$$

In equation (1), $r_A$, $r_B$, and $r_O$ are the ionic radii of A, B, and O, respectively.

$BaTiO_3$, as a tetragonal structure at room temperature, has a tolerance factor of approximately 1.06. The closer the tolerance factor is to 1, the closer to the cubic structure the crystal is. Referring to the graph of FIG. 14, the dielectric materials of Examples 4 to 6 and 10 to 15 have a smaller tolerance factor and higher permittivity, than $BaTiO_3$ (e.g., Comparative Example 1). In addition, the highest permittivity appears in a certain range of tolerance factors. This is interpreted as that as the solid solution compositions form polar nanoregions, the effective permittivity capable of responding to an AC field can be affected by crystallographic variation in the matrix surrounding the polar nanoregions. For example, without being limited by a particular theory, the energy barrier required to respond to an AC electric field is varied by the crystallographic variation of the matrix. The effective permittivity value may be highest at a crystallographic variation value having the lowest energy barrier.

Evaluation Example 8: Evaluation of Temperature Stability of Permittivity of Dielectric Materials of Examples 4 to 6 and 10 to 15

Figure 15A:
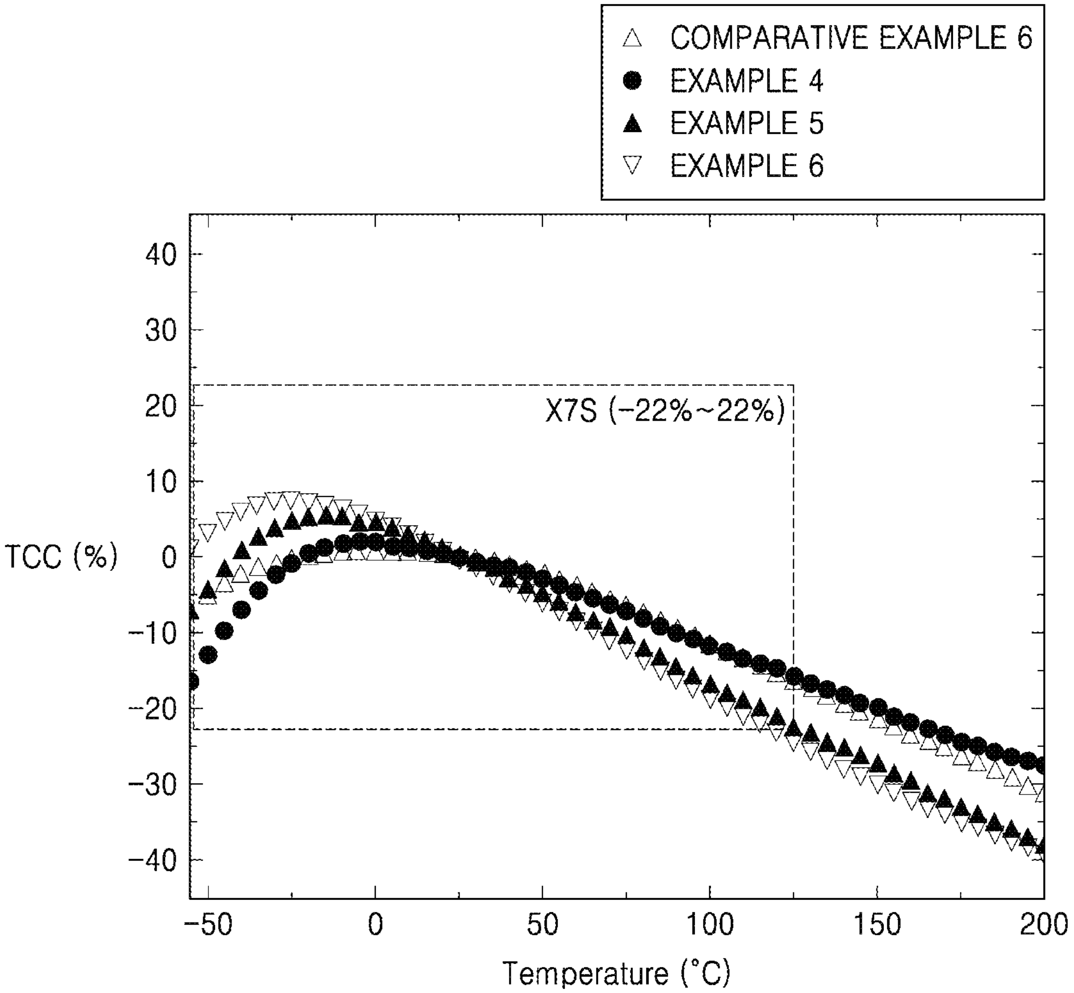
FIG. 15A is a graph of temperature coefficient of capacitance (TCC) according to temperature of the dielectric materials of Examples 4 to 6 and Comparative Example 6.
Figure 15B:
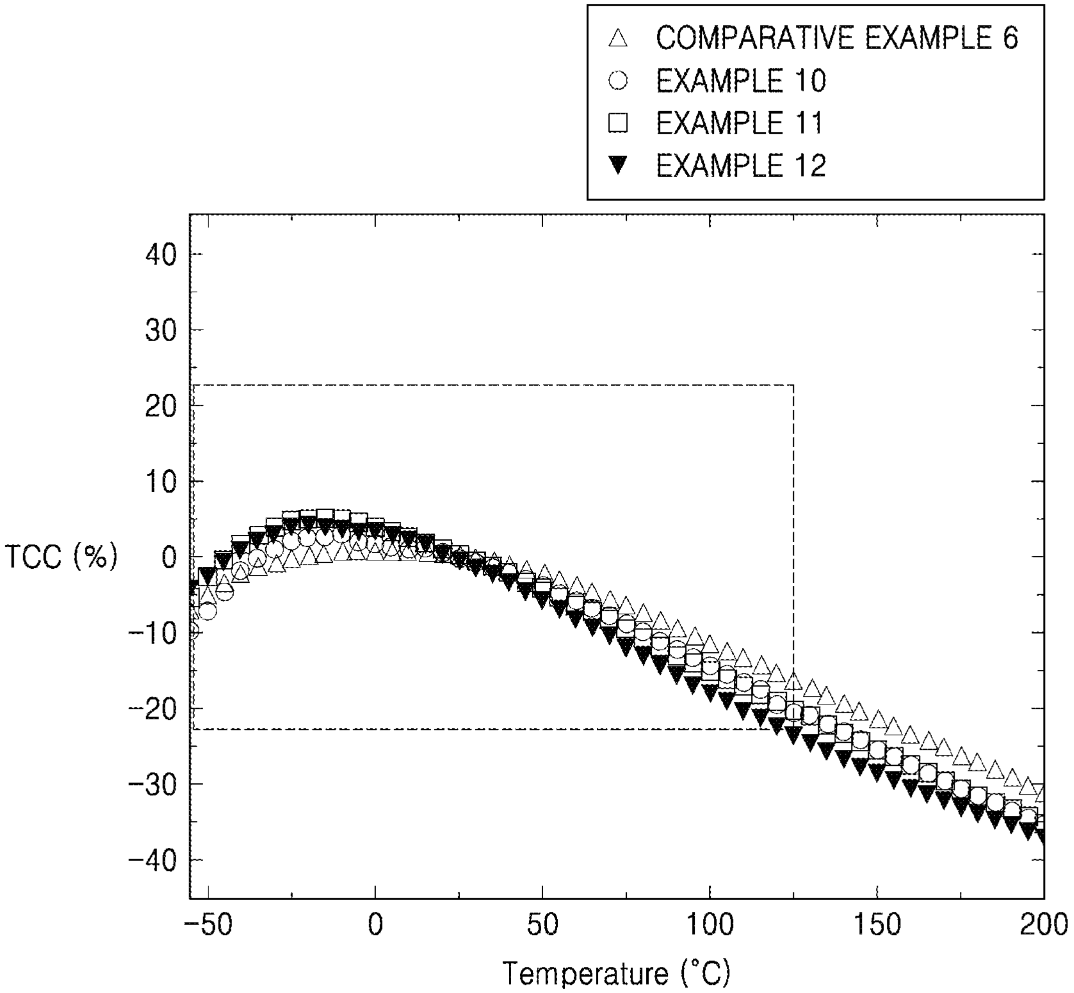
FIG. 15B is a graph of TCC according to temperature of the dielectric materials of Examples 10 to 12 and Comparative Example 6.
Figure 15C:
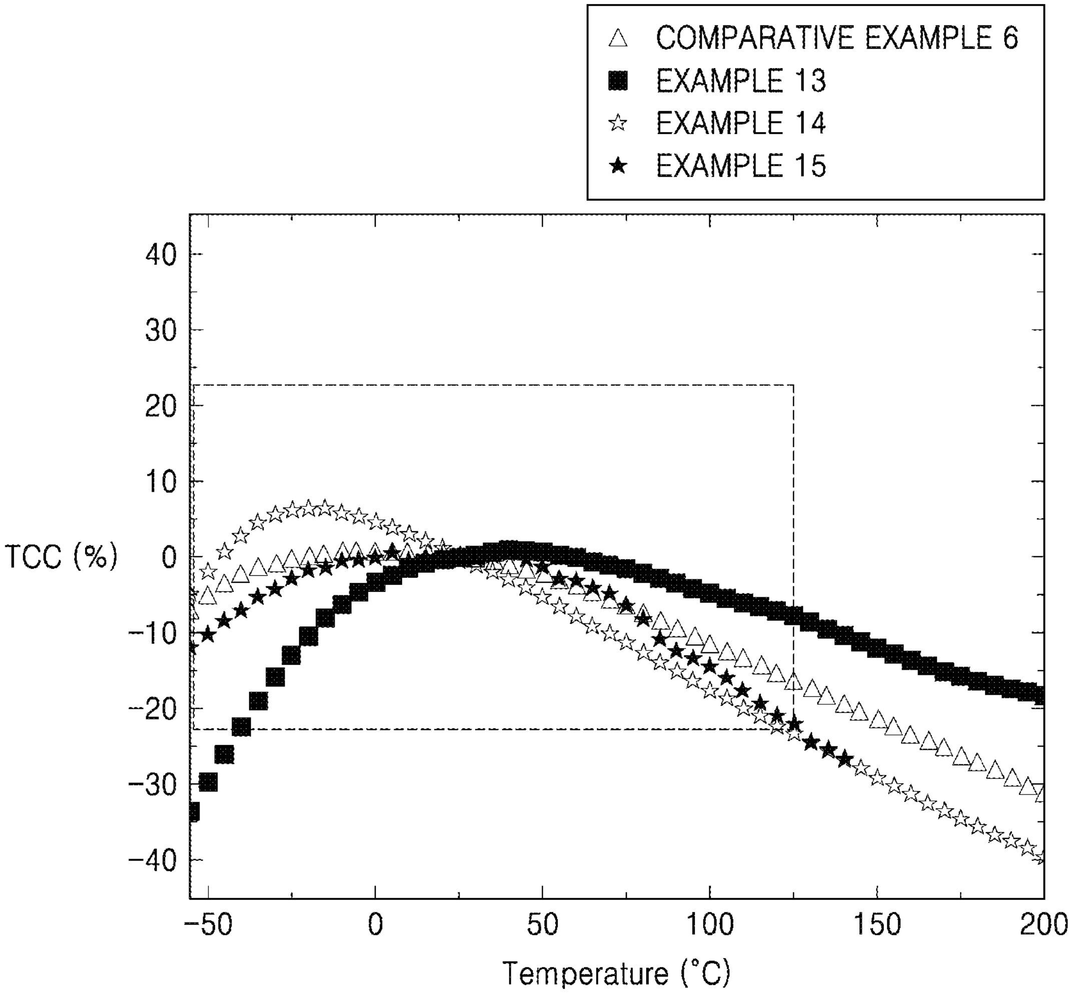
FIG. 15C is a graph of TCC according to temperature of the dielectric materials of Examples 13 to 15 and Comparative Example 6.

FIG. 15A is a graph of temperature coefficient of capacitance (TCC) according to temperature of the dielectric materials of Examples 4 to 6 and Comparative Example 6, FIG. 15B is a graph of TCC according to temperature of the dielectric materials of Examples 10 to 12 and Comparative Example 6, and FIG. 15C is a graph of TCC according to temperature of the dielectric materials of Examples 13 to 15 and Comparative Example 6.

The temperature coefficient of capacitance (TCC), which is a numerical value representing a rate of increase/decrease in permittivity according to change in temperature, represents the temperature stability of permittivity as expressed by Equation (2).

$$TCC = (C - C_{RT})/C_{RT} \times 100 \quad (2)$$

In Equation (2), C is a value of capacitance at a measurement temperature, and $C_{RT}$ is a value of capacitance at room temperature of 25° C.

Referring to FIGS. 15A, 15B, and 15C, the dielectric materials of Examples 4 to 6 and 10 to 15 satisfy the TCC specifications for the MLCC product group X7S (−22% to 22%) that is may be mass-produced at a temperature range of −55° C. to 125° C. except that TCC of the dielectric material of Example 13 is below −22% at below −40° C. It is found that comparing to existing $BaTiO_3$ dielectric materials, which exhibit a TCC of −28%~28% in the above temperature range, and need a plurality of additives to be added to meet the TCC requirements for X7S, the dielectric materials of Examples 4 to 6 and 10 to 15 have excellent temperature stability.

Evaluation Example 9: Permittivity According to Solid Solute Concentration of Dielectric Materials of Examples 16 to 24

Figure 16A:
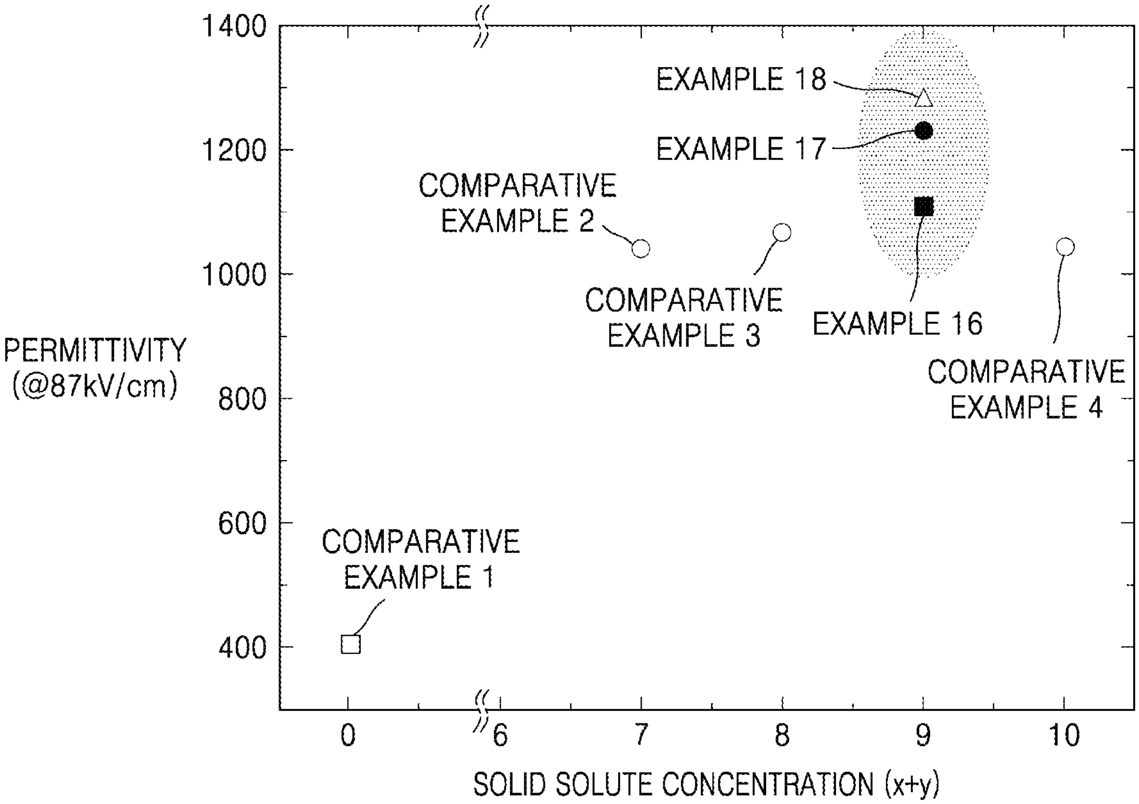
FIG. 16A is a graph of permittivity at 87 kV/cm of the dielectric materials of Examples 16, 17 and 18 and Comparative Examples 1 to 4.
Figure 16B:
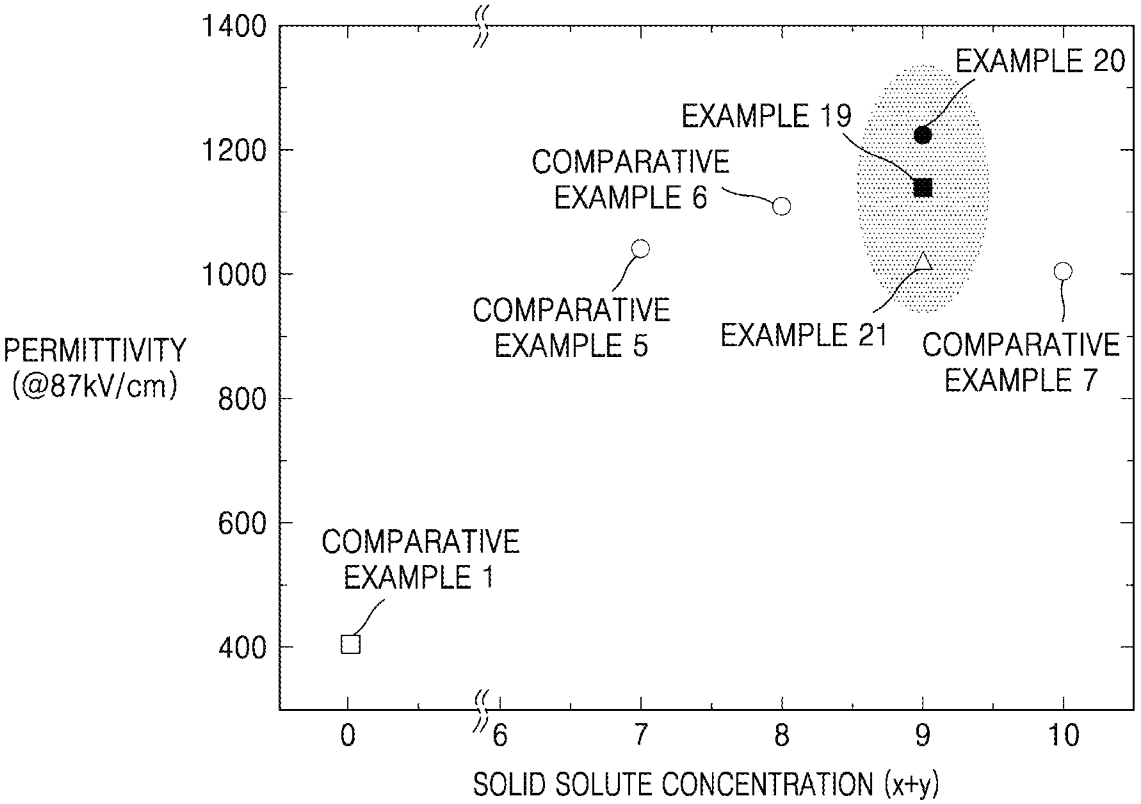
FIG. 16B is a graph of permittivity at 87 kV/cm of the dielectric materials of Examples 19 to 21 and Comparative Examples 1 and 5 to 7.
Figure 16C:
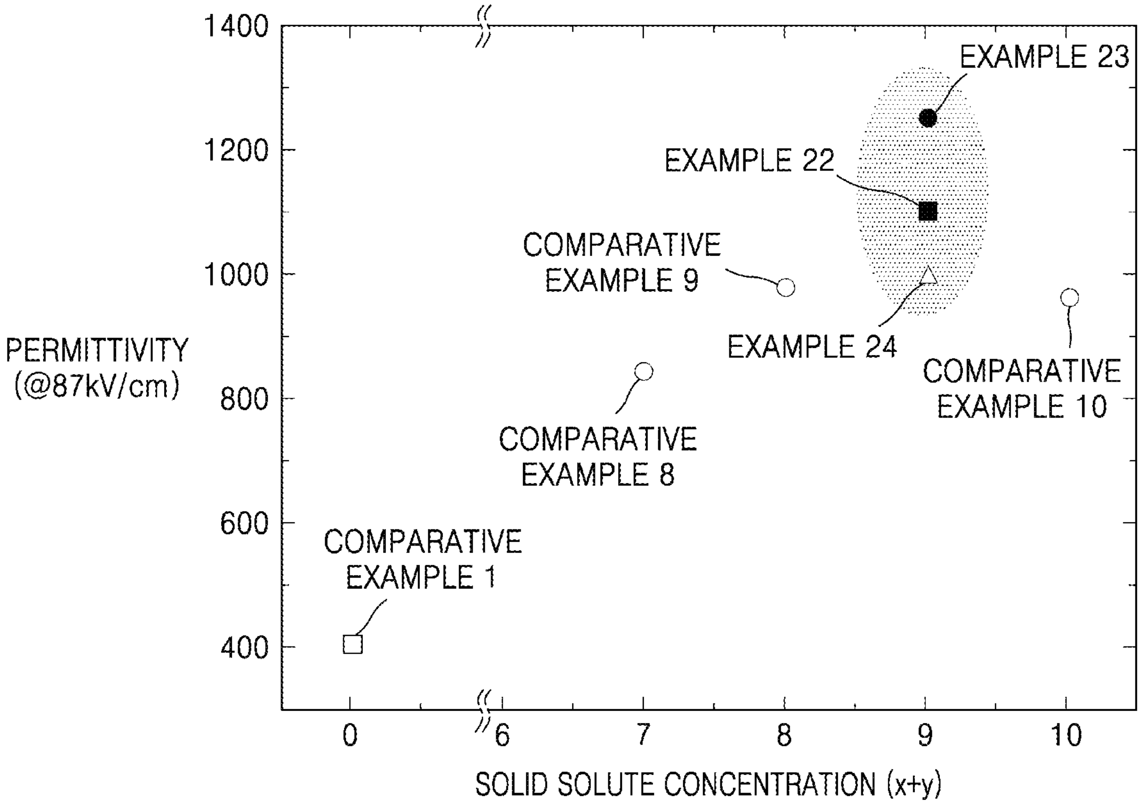
FIG. 16C is a graph of permittivity at 87 kV/cm of the dielectric materials of Examples 22 to 24 and Comparative Examples 1 and 8 to 10.

FIG. 16A is a graph of permittivity at 87 kV/cm of the dielectric materials of Examples 16, 17 and 18 and Comparative Examples 1 to 4, FIG. 16B is a graph of permittivity at 87 kV/cm of the dielectric materials of Examples 19 to 21 and Comparative Examples 1 and 5 to 7, and FIG. 16C is a graph of permittivity at 87 kV/cm of the dielectric materials of Examples 22 to 24 and Comparative Examples 1 and 8 to 10.

In the dielectric materials of Examples 16 to 24, a molar ratio of the first solid solute to second solid solute is 6:3, and a solid solution concentration (x+y) of a total of the solid solutes is 9 mol %. Referring to FIGS. 16A, 16B, and 16C, the dielectric materials of Examples 16 to 24 exhibit a permittivity of about 1,000 to 1,270 in an electric field of 87 kV/cm, which is higher than that of the dielectric materials of Comparative Examples 1 to 10 except Example 21.

Table 2 presents the specific resistivities and permittivities ($\varepsilon_0$, $\varepsilon$) at 0 kV/cm and 87 kV/cm of the dielectric materials of Examples 1 to 24. Table 3 presents the remnant polarization ($P_r$), temperature coefficients of capacitance (TCC), and tolerance factors of the dielectric materials of Examples 1 to 24.

TABLE 2

| | composition | resistivity (Ω · cm) | $\varepsilon_0$ (@0 kV/cm) | $\varepsilon$ (@87 kV/cm) |
|---|---|---|---|---|
| Example 1 | 91BT•8BH•1KN | 7.19E+11 | 3230 | 1091 |
| Example 2 | 90BT•8BH•2KN | 1.02E+12 | 2497 | 1171 |
| Example 3 | 89BT•8BH•3KN | 1.60E+12 | 2191 | 1190 |
| Example 4 | 91BT•8BT'•1KN | 8.30E+11 | 2236 | 1197 |
| Example 5 | 90BT•8BT'•2KN | 6.13E+12 | 1947 | 1193 |
| Example 6 | 89BT•8BT'•3KN | 1.34E+12 | 2244 | 1165 |
| Example 7 | 91BT•8BL•1KN | 1.26E+12 | 2202 | 1210 |
| Example 8 | 90BT•8BL•2KN | 1.24E+12 | 1999 | 1227 |
| Example 9 | 89BT•8BL•3KN | 1.36E+12 | 1801 | 1193 |
| Example 10 | 91BT•8BT'•1NN | 4.29E+11 | 2052 | 1327 |
| Example 11 | 90BT•8BT'•2NN | 1.53E+12 | 1833 | 1239 |
| Example 12 | 89BT•8BT'•3NN | 2.27E+12 | 1633 | 1191 |

TABLE 2-continued

| | composition | resistivity (Ω · cm) | $\varepsilon_0$ (@0 kV/cm) | ε (@87 kV/cm) |
|---|---|---|---|---|
| Example 13 | 91BT•8BT'•1RN | 1.33E+12 | 2297 | 1226 |
| Example 14 | 90BT•8BT'•2RN | 1.21E+12 | 2078 | 1160 |
| Example 15 | 89BT•8BT'•3RN | 1.25E+12 | 2118 | 1236 |
| Example 16 | 91BT•6BH•3KN | 1.21E+12 | 3176 | 1104 |
| Example 17 | 91BT•6BH•3NN | 4.02E+12 | 2408 | 1230 |
| Example 18 | 91BT•6BH•3RN | 3.41E+12 | 3699 | 1279 |
| Example 19 | 91BT•6BT'•3KN | 3.01E+12 | 2894 | 1138 |
| Example 20 | 91BT•6BT'•3NN | 1.63E+12 | 2396 | 1223 |
| Example 21 | 91BT•6BT'•3RN | 1.02E+12 | 2809 | 1012 |
| Example 22 | 91BT•6BL•3KN | 2.60E+12 | 3268 | 1094 |
| Example 23 | 91BT•6BL•3NN | 1.16E+12 | 2639 | 1251 |
| Example 24 | 91BT•6BL•3RN | 4.71E+12 | 3609 | 991 |

TABLE 3

| | composition | $P_r$, μC/cm (@69 kV/cm) | TCC, % | Tolerance factor |
|---|---|---|---|---|
| Example 1 | 91BT•8BH•1KN | 0.5 | −26.5~3.8 | 1.051 |
| Example 2 | 90BT•8BH•2KN | 0.26 | −26.8~7.6 | 1.050 |
| Example 3 | 89BT•8BH•3KN | 0.23 | −28~10 | 1.050 |
| Example 4 | 91BT•8BT'•1KN | 0.26 | −15.6~2 | 1.051 |
| Example 5 | 90BT•8BT'•2KN | 0.67 | −22~5.2 | 1.051 |
| Example 6 | 89BT•8BT'•3KN | 0.29 | −23.9~7.9 | 1.051 |
| Example 7 | 91BT•8BL•1KN | 0.2 | −20.5~31 | 1.052 |
| Example 8 | 90BT•8BL•2KN | 0.32 | −20~4.4 | 1.052 |
| Example 9 | 89BT•8BL•3KN | 0.27 | −23.1~4.5 | 1.052 |
| Example 10 | 91BT•8BT'•1NN | 1.79 | −20~2.9 | 1.050 |
| Example 11 | 90BT•8BT'•2NN | 0.16 | −20~4.9 | 1.049 |
| Example 12 | 89BT•8BT'•3NN | 0.1 | −23.1~4.5 | 1.048 |
| Example 13 | 91BT•8BT'•1RN | 0.41 | −33~0.9 | 1.051 |
| Example 14 | 90BT•8BT'•2RN | 0.28 | −23~6.2 | 1.051 |
| Example 15 | 89BT•8BT'•3RN | 1.71 | −21.5~1.1 | 1.052 |
| Example 16 | 91BT•6BH•3KN | 0.61 | −37.8~15.5 | 1.056 |
| Example 17 | 91BT•6BH•3NN | 0.27 | −30.9~9.6 | 1.053 |
| Example 18 | 91BT•6BH•3RN | 3.85 | −41.8~15.3 | 1.056 |
| Example 19 | 91BT•6BT'•3KN | 0.46 | −33.7~12.3 | 1.056 |
| Example 20 | 91BT•6BT'•3NN | 0.32 | −31.5~9.3 | 1.053 |
| Example 21 | 91BT•6BT'•3RN | 0.43 | −40.7~15.3 | 1.057 |
| Example 22 | 91BT•6BL•3KN | 1.13 | −39~10.1 | 1.057 |
| Example 23 | 91BT•6BL•3NN | 0.41 | −30.6~10.3 | 1.054 |
| Example 24 | 91BT•6BL•3RN | 0.91 | −46~2.6 | 1.058 |

Referring to Tables 2 and 3, all of the dielectric materials of Examples 1 to 24 exhibit a high permittivity of 990 or more at high electric field (@87 kV/cm), and especially all of the dielectric materials of Examples 1 to 23 exhibit a permittivity of 1,000 or higher at high electric field.

Referring to Tables 2 and 3, the dielectric materials of Examples 1 to 15 having a ratio of the first solid solute and the second solid solute that is 8:1, 8:2, or 8:3 exhibit higher temperature stability than that of the dielectric materials of Examples 16 to 24 having a 6:3 ratio of the first solid solute and the second solid solute.

As described above, according to the one or more embodiments, provided are dielectric materials that have multiple polar nanoregions, and thus have improved structural stability and physical properties and can effectively operate in a high electric field region.

The dielectric material according to the one or more embodiments can effectively operate in a high electric field region, and can be used to manufacture a capacitor having high efficiency according to the thinning of a dielectric layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric material having a composition represented by Formula 1:

$$(100\text{-}x\text{-}y)BaTiO_3.xBiREO_3.yABO_3 \quad \text{<Formula 1>}$$

wherein, in Formula 1,

RE is at least one of thulium (Tm) or lutetium (Lu),

A is an alkali metal,

B is a pentavalent transition metal, and $0<x\leq 20$, $0<y\leq 10$, and $0<x+y\leq 30$, wherein the dielectric material is a solid solution.

2. The dielectric material of claim 1, wherein the A includes at least one of sodium (Na), potassium (K), or rubidium (Rb).

3. The dielectric material of claim 1, wherein the B includes at least one of vanadium (V), niobium (Nb), or tantalum (Ta).

4. The dielectric material of claim 1, wherein the B includes niobium (Nb).

5. The dielectric material of claim 1, wherein the A includes at least one of sodium (Na), potassium (K), or rubidium (Rb), and the B includes at least one of vanadium (V), niobium (Nb), or tantalum (Ta).

6. The dielectric material of claim 5, wherein the dielectric material is represented by at least one of (100-x-y) $BaTiO_3$.$xBiTmO_3$.$yKNbO_3$, (100-x-y)$BaTiO_3$.$xBiTmO_3$.$yNaNbO_3$, (100-x-y)$BaTiO_3$.$xBiTmO_3$.$yRbNbO_3$, (100-x-y)$BaTiO_3$.$xBiLuO_3$.$yKNbO_3$, (100-x-y)$BaTiO_3$. $xBiLuO_3$.$yNaNbO_3$, or (100-x-y)$BaTiO_3$.$xBiLuO_3$.$yRbNbO_3$.

7. The dielectric material of claim 1, wherein the solid solution comprises a first solid solute and a second solid solute, the first solid solute includes the $BiREO_3$, and the second solid solute includes the $ABO_3$.

8. The dielectric material of claim 1, wherein the dielectric material comprises a plurality of domains, each of the plurality of domains including a ferroelectric material; and a plurality of first polar nanoregions and second polar nanoregions in the ferroelectric material of each of the plurality of domains, and the dielectric material is a relaxor-ferroelectric material.

9. The dielectric material of claim 8, wherein the first polar nanoregions include a first solid solute, the second polar nanoregions include a second solid solute, the first solid solute includes the $BiREO_3$, and the second solid solute includes the $ABO_3$.

10. The dielectric material of claim 8, wherein the ferroelectric material includes the $BaTiO_3$.

11. The dielectric material of claim 8, wherein at least one of the first or second polar nanoregions has spontaneous polarization characteristics.

12. The dielectric material of claim 8, wherein at least one of the first or second polar nanoregions has a lower energy barrier, in response to an alternating current (AC) sweep, than the ferroelectric material.

13. The dielectric material of claim 1, wherein the dielectric material comprises a pseudo-cubic crystal structure.

14. The dielectric material of claim 1, wherein the dielectric material has a temperature coefficient of capacitance (TCC) of −22% to 22% at −55° C. to 125° C.

15. The dielectric material of claim 1, wherein the dielectric material has a resistivity of $1.0\times10^{11}$ Ω·cm or more.

16. A device comprising:

a plurality of electrodes; and a dielectric layer between the plurality of electrodes, wherein the dielectric layer comprises the dielectric material of claim 1.

17. The device of claim 16, wherein the device is a multi-layered capacitor.

18. The device of claim 16, wherein the plurality of electrodes comprise a plurality of first electrodes and a plurality of second electrodes, and the first electrodes and the second electrodes alternate.

19. A memory device comprising:

a transistor; and a capacitor, wherein at least one of the transistor or capacitor includes the device of claim 16.

20. The dielectric material of claim 1, wherein the dielectric material has a permittivity of 900 or more at 0 kV/cm to 87 kV/cm.

21. The dielectric material of claim 1, wherein the dielectric material has a temperature coefficient of capacitance (TCC) of −40% to 22% at a temperature of 55° C. to 125° C.

* * * * *